US010620377B1

(12) United States Patent
Burckel et al.

(10) Patent No.: US 10,620,377 B1
(45) Date of Patent: Apr. 14, 2020

(54) KINEMATIC CHIP TO CHIP BONDING

(71) Applicant: National Technology & Engineering Solutions of Sandia, LLC, Albuquerque, NM (US)

(72) Inventors: David Bruce Burckel, Albuquerque, NM (US); Todd Bauer, Albuquerque, NM (US); Michael David Henry, Albuquerque, NM (US); Andrew Pomerene, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 567 days.

(21) Appl. No.: 15/084,164

(22) Filed: Mar. 29, 2016

Related U.S. Application Data

(60) Provisional application No. 62/141,705, filed on Apr. 1, 2015.

(51) Int. Cl.
| | |
|---|---|
| *G02B 6/30* | (2006.01) |
| *G02B 6/42* | (2006.01) |
| *G02B 6/36* | (2006.01) |
| *H01S 5/022* | (2006.01) |
| *H01S 5/30* | (2006.01) |
| *H01S 5/22* | (2006.01) |
| *H01S 5/12* | (2006.01) |

(52) U.S. Cl.
CPC ............. *G02B 6/30* (2013.01); *G02B 6/3636* (2013.01); *G02B 6/423* (2013.01); *H01S 5/02284* (2013.01); *H01S 5/12* (2013.01); *H01S 5/22* (2013.01); *H01S 5/3013* (2013.01)

(58) Field of Classification Search
CPC ......... G02B 6/30; G02B 6/3636; G02B 6/423
See application file for complete search history.

(56) References Cited

U.S. PATENT DOCUMENTS 5,175,781 A * 12/1992 Hockaday ................ G02B 6/30
385/49
5,218,663 A * 6/1993 Isono ..................... G02B 6/122
385/129
5,768,456 A * 6/1998 Knapp ................. G02B 6/4249
385/49

(Continued)

*Primary Examiner* — Sung H Pak
*Assistant Examiner* — Hoang Q Tran
(74) *Attorney, Agent, or Firm* — Medley, Behrens & Lewis, LLC

(57) ABSTRACT

The various technologies presented herein relate to integrating an IC having at least one waveguide incorporated therein with a v-groove array IC such that an optical fiber located in a v-groove is aligned relative to a waveguide in the IC maximizing optical coupling between the fiber and the waveguide. The waveguide IC and the v-groove array IC are bonded in a stacked configuration. Alignment of the waveguide IC and the array IC in the stacked configuration enables advantage to be taken of lithographic accuracy of features formed with respect to the Z-direction. Further, kinematic pins and sockets are utilized to provision accuracy in the X- and Z-directions, wherein advantage is taken of the placement accuracy and fabrication tolerance(s) which can be utilized when forming the and sockets. Accordingly, automated alignment of the waveguide IC and the array IC is enabled, facilitating accurate alignment of the respective waveguides and fibers.

15 Claims, 16 Drawing Sheets

(56) References Cited

U.S. PATENT DOCUMENTS

| | | | |
|---|---|---|---|
| 6,416,234 B1 | 7/2002 | Wach et al. | |
| 6,574,053 B1 | 6/2003 | Spinali | |
| 7,145,157 B2 | 12/2006 | Simmons et al. | |
| 2003/0031421 A1* | 2/2003 | Kiani | G02B 6/3882 |
| | | | 385/59 |
| 2003/0076602 A1 | 4/2003 | Nishikawa | |
| 2004/0060324 A1 | 4/2004 | Johannessen | |
| 2005/0163431 A1* | 7/2005 | Moynihan | G02B 6/1221 |
| | | | 385/60 |
| 2016/0116695 A1* | 4/2016 | Nekado | G02B 6/421 |
| | | | 385/14 |

* cited by examiner

KINEMATIC CHIP TO CHIP BONDING

RELATED APPLICATION

This application claims priority to U.S. Provisional Patent Application No. 62/141,705, filed on Apr. 1, 2015, and entitled "KINEMATIC CHIP TO CHIP BONDING", the entirety of which is incorporated herein by reference.

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

As a technology, integrated photonics has made steady progress since its inception approximately 30 years ago. Optical fiber technology propagates light through glass fibers, wherein the glass fibers are created by drawing molten glass rods down to 10s to 100s of micrometers (μm's) in diameter. With integrated photonics, waveguides are fabricated on semiconductor substrates, wherein the waveguides are typically formed utilizing semiconductor materials, or at least materials compatible with semiconductor manufacturing. For some direct bandgap material systems such as III-V (gallium arsenide (GaAs), indium phosphide (InP), indium gallium arsenide (InGaAs), aluminum gallium arsenide (AlGaAs), etc.) light can be generated, as well as conducted, in the waveguides. In other material systems having indirect bandgaps (e.g., silicon (Si) and germanium (Ge)) light cannot be generated efficiently, and is typically created externally and coupled into the integrated waveguides. Silicon is technologically important because of the enormous infrastructure around silicon complementary metal-oxide semiconductor (CMOS) technology and the potential for tight integration between electronic and photonic technologies.

In order for either direct bandgap or indirect bandgap integrated photonic chips (integrated circuits (ICs), dies) to communicate with other devices on a network, it is necessary to couple from an optical fiber onto the integrated photonics chip, and/or from the photonics chip into the optical fiber. This coupling is dependent on an ability to accurately align the integrated waveguide included in the chip to the high index core of the optical fiber which carries the optical signal. The alignment process is complicated by the dimensions of the waveguides. While the core (e.g., diameter) of the optical fiber can be on the order of 10 microns (μm) or smaller, contained inside a cladding (e.g., of approximately 125 μm), the integrated waveguides can be significantly smaller (100s of nm) due to their high index of refraction. Accordingly, misalignment of an optical fiber/waveguide pair can result in (often appreciable) insertion loss.

SUMMARY

The following is a brief summary of subject matter that is described in greater detail herein. This summary is not intended to be limiting as to the scope of the claims.

Various exemplary embodiments presented herein relate to aligning integrated circuits (ICs, chips, dies) to facilitate coupling of optical fibers and waveguides respectively included therein to maximize high efficiency coupling, while minimizing insertion losses, therebetween. The technique can also be used to align any two ICs that have a requirement(s) for in-plane alignment. For example, IC applications where through silicon vias are utilized to connect separate ICs vertically for 3D-IC implementations. When aligning two separate ICs, each of which can be translated in 3 dimensions, and rotated about all three axes (X, Y, Z), the problem becomes one of aligning two substrates with 6 degrees of freedom (6-DOF).

Per the various embodiments presented herein, advantage is taken of the respective tolerances with which a particular feature in an IC(s) is fabricated. For example, the thickness of a layer formed (e.g., deposited) upon a substrate can be known to a high degree of accuracy (e.g., thickness is known/controlled to nanometer (nm) tolerances). Hence, by locating a first IC (having a first layer formed on a first substrate) with a second IC (having a second layer formed on a second substrate), wherein the first IC and second IC are positioned in a stacked arrangement such that the respective layers are located proximate to each other (e.g., facing each other), any positional error in the Z-direction can be controlled/known to the nm tolerances with which the first and second layers were formed. While it might not be desired for the first layer and the second layer to abut each other, a plurality of standoffs can be utilized to maintain separation between the layers, wherein the plurality of standoffs can be fabricated with high dimensional accuracy.

To facilitate alignment in the XY plane, the first IC and second IC can be fabricated with a plurality of kinematic pins and sockets formed thereon/therein. Each socket is formed with sloping sides, e.g., an inverted pyramid, wherein the base forms an opening in the second layer of the second IC and the sloped sides converge at an apex in second substrate. As the first IC is integrated with the second IC, the pins (located on the first IC) locate in the respective sockets and the second IC self-aligns with the first IC based upon a particular pin locating in a particular socket. As the first IC is lowered towards the second IC, interaction of the end of the pin with a sidewall of the socket causes the second IC to be displaced in the X-Y plane to accommodate the downward moving pin, accordingly, upon termination of movement of the pin, the second IC has self-aligned to a desired position. Accurate placement of the first IC and the second IC in the X-Y plane can be achieved based upon the tolerances with which the pin(s) and socket(s) can be fabricated.

In an embodiment, the first IC can comprise an array of channels (v-grooves) which can be utilized to locate and align a plurality of optical fibers. Further, the second IC can include a plurality of waveguides (e.g., formed in a silicon substrate of the second IC), wherein the respective ends of the optical fibers and waveguides are to be accurately aligned with respect to each other. The accurate alignment of the optical fibers to the waveguides can be achieved based upon the accuracy of alignment of the first IC with the second IC. Upon desired alignment of the first IC and the second IC, a clamping structure can be utilized to locate the optical fibers relative to the waveguides, wherein the respective ends of the optical fibers located in the grooves of the first IC are aligned with the respective ends of the waveguides in the second IC.

A plurality of connectors can be located on the first IC and/or the second IC, wherein the plurality of connectors can be formed from a malleable material such that during alignment of the first IC with the second IC, the material deforms to form electrical pathways between the first IC and the second IC.

Alignment of the first IC and the second IC can be performed utilizing a wafer bonding tool (e.g., an automated die/flip chip bonder). While such a tool has alignment tolerances in the micrometer range (e.g., ±0.5 μm placement accuracy, ±1 μm post-bond accuracy), the accuracy with which the second IC is aligned to the first IC is based upon the manufacturing tolerances of respective features of the first IC and the second IC. For example, layers can be formed with nanometer (nm) (sub-μm) precision (deposition level of accuracy), enabling accuracy in the Z-direction. Further, the pin and the socket can be formed with lithographic tolerances, e.g., dimensional and positional accuracy/tolerancing is deep sub-μm. Hence, the various embodiments presented herein enable the first IC and the second IC to be positioned with an accuracy that exceeds the positional accuracy of the wafer bonding tool.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1A:
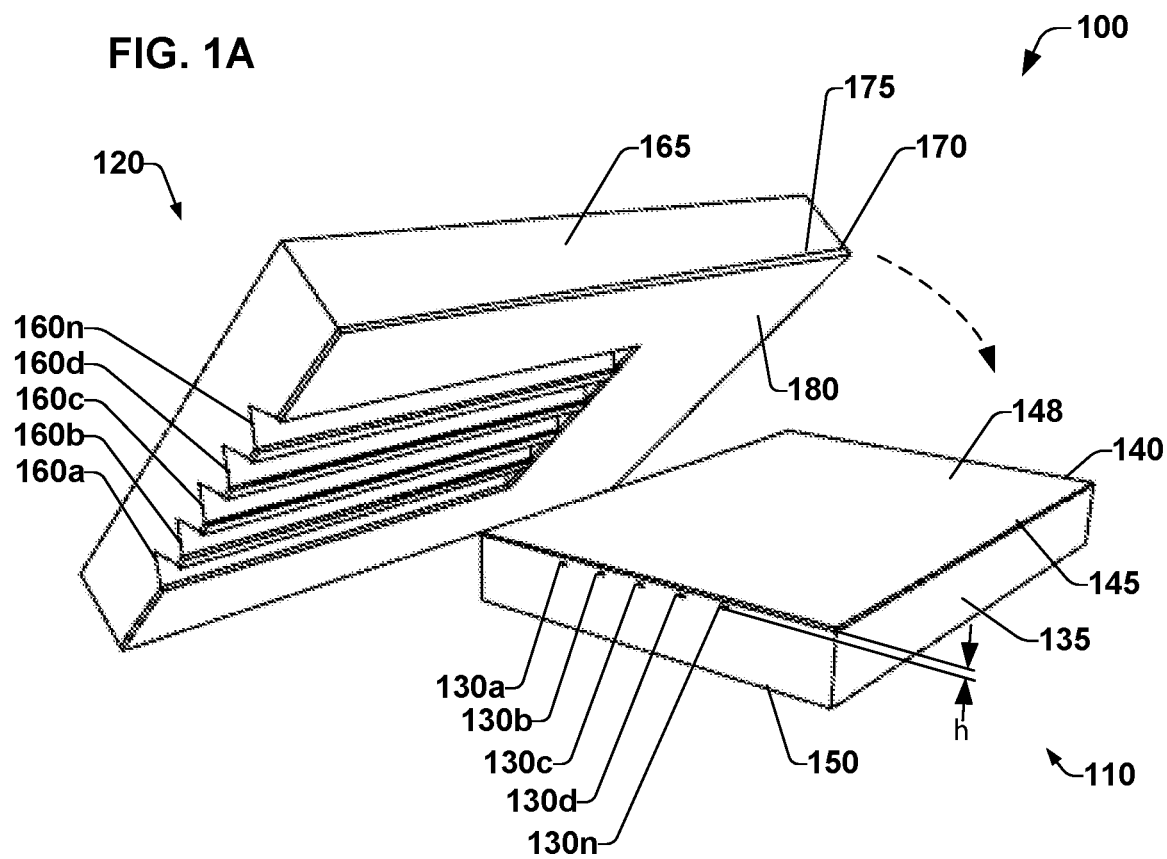
FIG. 1A illustrates a first IC being integrated with a second IC, according to an embodiment.

Various technologies pertaining to alignment of integrated circuits (ICs) to effect a high accuracy of IC to IC bonding (and coupling between optical fibers and waveguides and/or semiconductor waveguide to semiconductor waveguide (e.g., direct coupling from III-V laser to silicon integrated waveguide)) are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

As previously mentioned, misalignment of an optical fiber/waveguide pair or waveguide/waveguide pair can result in insertion loss. The following embodiments present structures and methods for alignment of optical fibers located in a v-groove array to a semiconductor waveguide. The embodiments can be applied to any structures where alignment accuracy is desired, e.g., align a semiconductor waveguide(s) formed in an optically active medium (III-V material) with a silicon waveguide(s), from a III-V waveguide(s) to another III-V waveguide(s), a silicon waveguide(s) to another silicon waveguide(s), to and/or from lithium niobate waveguide(s), etc. A conventional approach to address such misalignment of the fiber-to-waveguide pair is to place the optical fiber in a v-groove IC (carrier chip) and then align the v-groove IC to an integrated photonics IC by placing both on 3-axis stages and adjusting the position of the structures manually, which can be a tedious operation.

Figure 18:
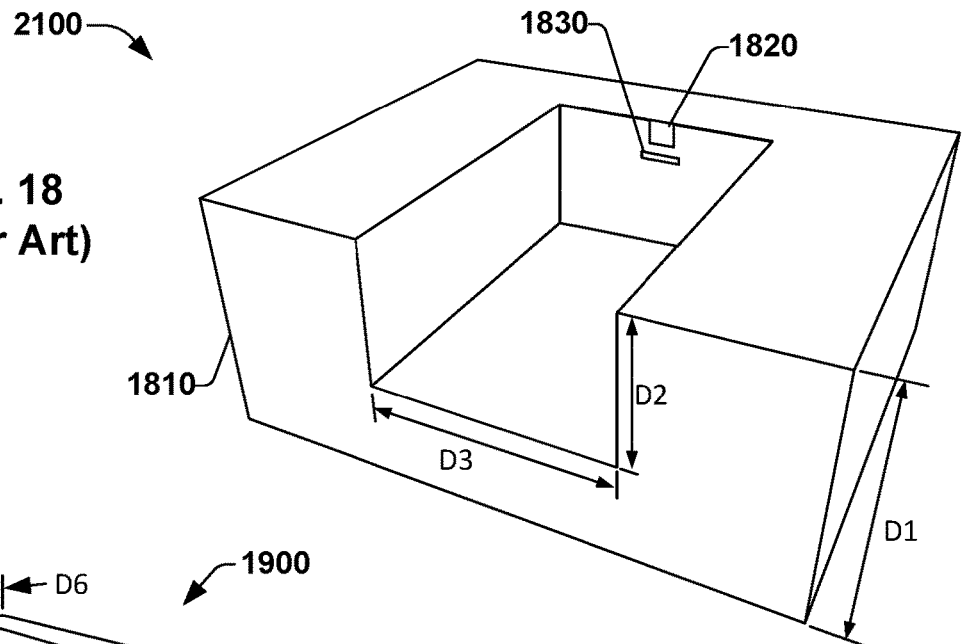
FIG. 18 illustrates a silicon integrated photonic IC comprising a substrate which includes a first waveguide and a second waveguide.
Figure 19:
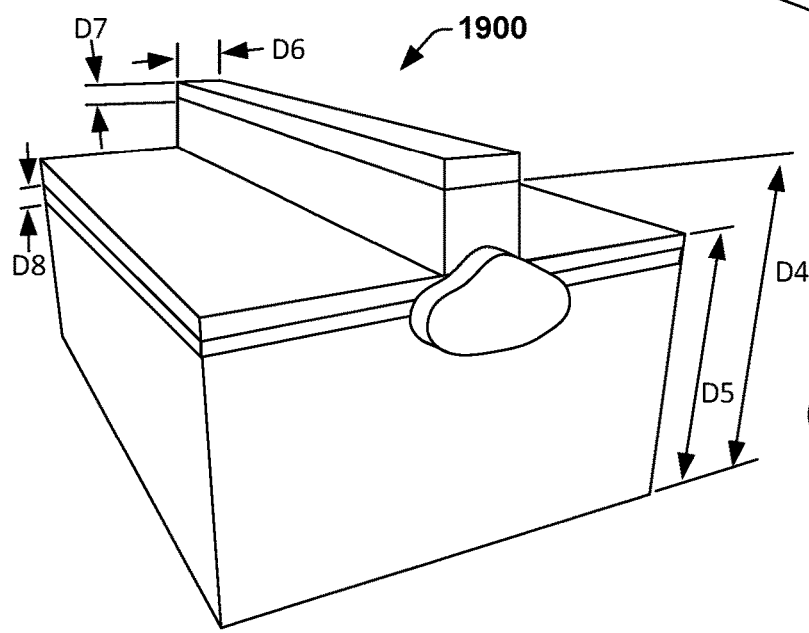
FIG. 19 illustrates an indium phosphide (InP) distributed feedback (DFB) ridge laser.
Figure 20:
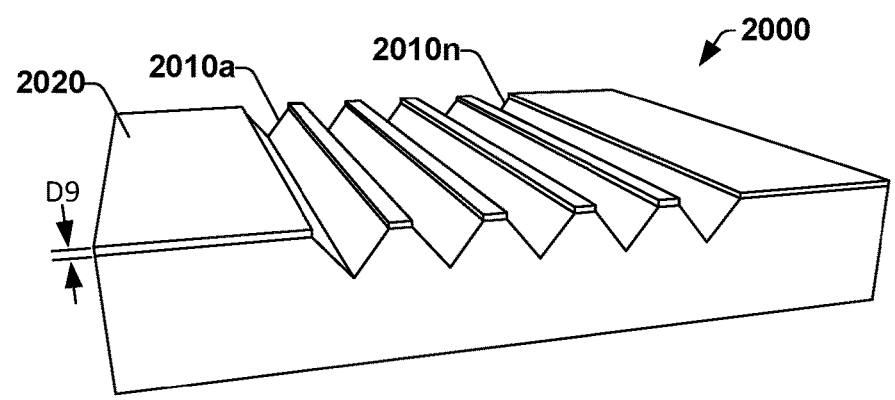
FIG. 20 illustrates a v-groove array IC comprising a plurality of channels.

The various embodiments presented herein are directed toward a passive alignment technique(s) that can achieve respective alignment tolerances required for high efficiency coupling. There are several physical dimensions that are relevant to the issue of achieving good coupling, wherein each dimension has a degree of precision (dimensional tolerance) pertaining thereto. FIGS. 18-21B illustrate various structures, and dimensioning issues relating to various features, that can be utilized to generate light and/or facilitate light transmission through optical fibers and waveguides. FIG. 18 presents a silicon integrated photonic IC 1800 comprising a substrate 1810 which includes a first waveguide 1820 (e.g., a silicon nitride ($Si_3N_4$) waveguide) and a second waveguide 1830 (e.g., a Si waveguide), wherein the waveguides can be enclosed (buried) in an oxide. FIG. 19 presents an indium phosphide (InP) distributed feedback (DFB) ridge laser 1900. FIG. 20 illustrates a v-groove array 2000 comprising a plurality of channels (e.g., v-grooves) 2010a-n and a layer 2020 formed thereon, where n is a positive integer. The channels 2010a-n are configured to locate/align (e.g., axially align) a plurality of optical fibers (not shown). In the various configurations 1800, 1900, and 2000, the thickness of the entire die, the respective substrate thicknesses (e.g., D1, D4, D5) are typically quoted in microns (μm). Other dimensions such as a trench (e.g., D2) can vary over a wafer by some percentage of the etch depth, which can be sizeable for etch depths of 100s of microns (e.g., as formed by a Bosch etch, or other suitable process). Other dimensions such as lithographic dimensions that may define the ridge waveguide (e.g., D6) of the ridge laser 1900, the lateral extent (e.g., D3) of the Bosch etched trench, can be from deep sub-μm to sub-μm, depending on process tolerance and exposure method (e.g., high-end stepper vs contact lithography).

Deposited film thicknesses are typically accurate to a few nanometers (e.g., the thickness (e.g., D9) of the layer 2020) while some of the dimensions, such as the laser ridge height (e.g., D7) and the quantum well thickness (e.g., D8) are epitaxially grown, and can hence be defined to atomic precision.

Figure 21A:
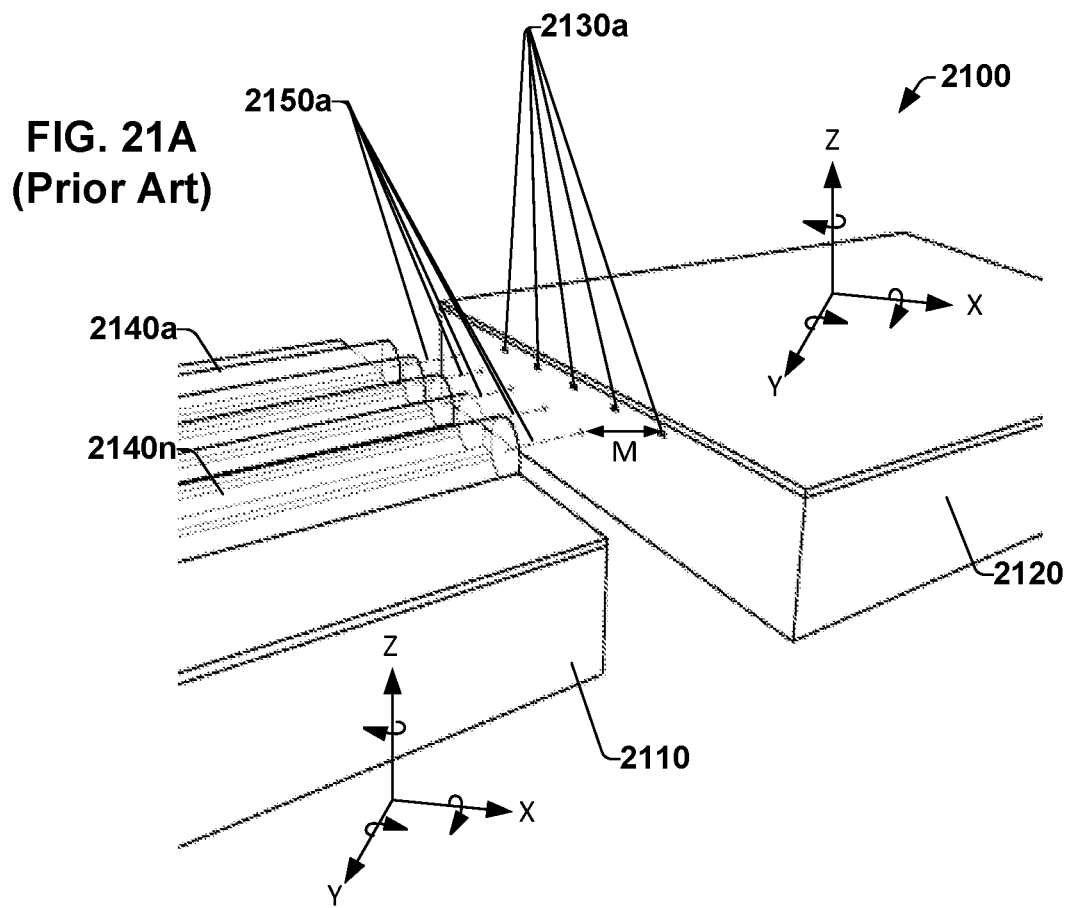
FIGS. 21A and 21B illustrate respective views of a v-groove array IC aligned with a substrate having a plurality of waveguides included therein.
Figure 21B:
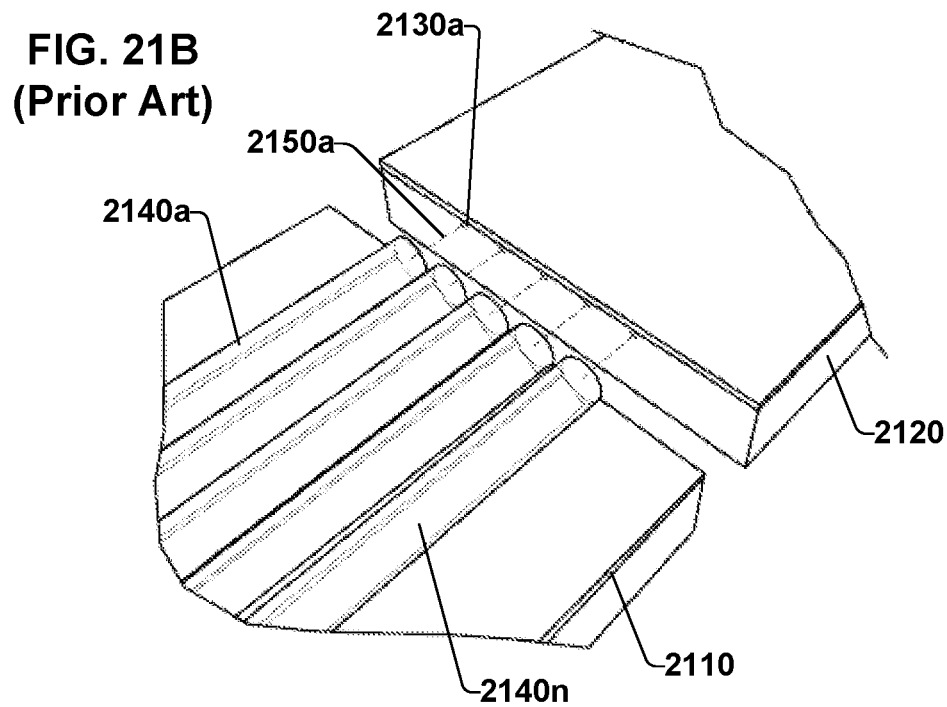

FIGS. 21A and 21B presents a schematic 2100 of a v-groove array 2110 (e.g., similar to array 2000) aligned with a substrate 2120 having a plurality of waveguides 2130a-n included therein. As shown, a plurality of optical fibers 2140a-n are located in the channels 2010a-n, wherein placement/alignment of the array 2110 directly affects alignment of the optical fibers 2140a-n (and the channels 2010a-n) relative to respective waveguides 2130a-n, core axes 2150a-n for the optical fibers 2140a-n are shown. Per FIG. 21A, owing to misalignment of the array 2110 with the substrate 2120, light emerging from the respective optical fiber 2140a-n (e.g., along respective core axis 2150a-n) is misaligned with regard to the location of the respective waveguide 2130a-n, e.g., by a distance M. Per FIG. 21B, the array 2110 and the substrate 2120 are aligned such that light emerging from the respective optical fiber 2140a-n (e.g., along respective core axis 2150a-n) is incident upon a respective waveguide 2130a-n (and vice-versa). Achieving good optical coupling and/or high % transmission from the off-chip waveguide (either another semiconductor waveguide (e.g., similar to 2120) or an optical fiber in a v-groove silicon IC (e.g., similar to 2110)), can be alleviated somewhat by modifying the electromagnetic mode (EM) profiles in both the input and receiving waveguide (e.g., any of waveguides 2130a-n). However, regardless of the amount of engineering that goes into the EM management, improved alignment between the waveguides and the optical fibers yields improved optical coupling. In typical applications, sub-micron alignment of the input optical fibers and receiving waveguides is desired. Furthermore, there are also differences in achieving alignment in the plane of the chip surface (X-Y directions), and in the Z-direction, normal to the wafer surface. These constraints put limits on which physical surfaces are utilized to achieve passive alignment. Hence, any approach which relies on measurements from the substrate bottom, or a trench deep enough to accommodate a carrier chip will not provide sub-micron alignment in the Z-direction. When aligning two separate die, each of which can be translated in 3 dimensions, and rotated about all three axes, the problem becomes one of aligning two substrates with 6 degrees of freedom (6-DOF), e.g., tilt, tip, yaw, etc.

Figure 1B:
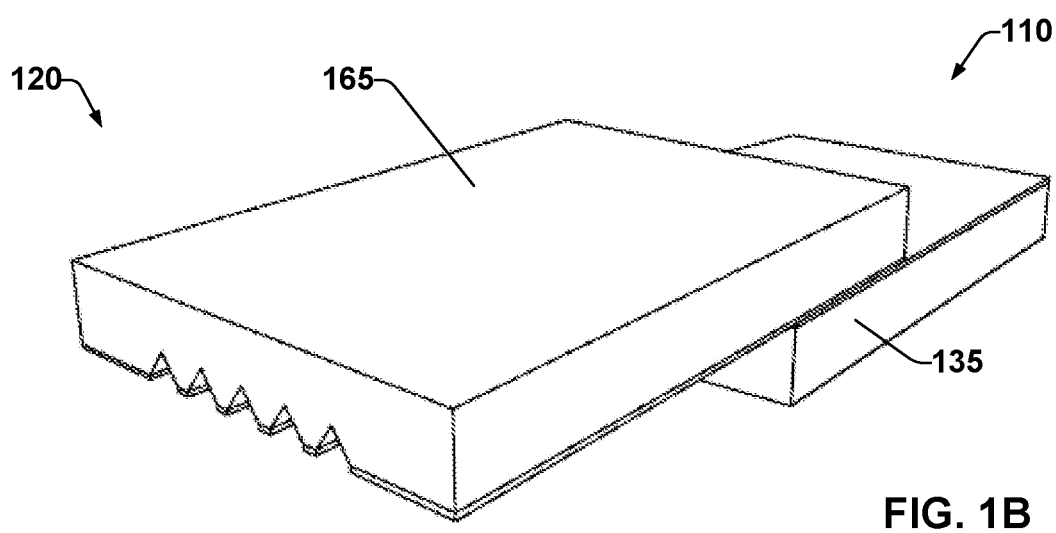
FIG. 1B illustrates a first IC being integrated with a second IC, according to an embodiment

The various embodiments presented herein can achieve alignment in the Z-direction by flipping one of the die and bonding the two dies face to face (bond face-to-face), and further utilizing pins and sockets to enable alignment in the X- and Y-directions. FIGS. 1A and 1B illustrate a configuration 100 comprising a pair of semiconductor devices (ICs) 110 and 120 wherein, compared to a typical lateral alignment (as shown in FIG. 21B), the IC 110 and IC 120 are in a stacked arrangement. The IC 110 includes a plurality of waveguides 130a-130n (e.g., in configuration 100, n=5) located in a substrate 135, and a layer 140 formed on an upper surface 145 of the substrate 135, wherein the layer 140 has an external surface 148. As shown, the waveguides 130a-n have respective ends exposed in a sidewall 150 of the substrate 135. The IC 120 comprises a plurality of channels (grooves, v-grooves) 160a-n formed in a substrate 165, wherein each channel in the plurality of channels 160a-n can be utilized to locate and align a respective optical fiber (e.g., per FIGS. 21A-B). The IC 120 can further include a layer 170 formed on a surface 175 of the substrate 165, wherein the channels 160a-n are formed such that the channels 160a-n extend from an external surface 180 of the layer 170, through the layer 170 and into the substrate 165. As shown in FIG. 1B, placement of the ICs 110 and 120 in a stacked arrangement enables each optical fiber located by the respective channels 160a-n to be aligned with a respective waveguide 130a-n in IC 110 to facilitate light transmission between an optical fiber and its corresponding waveguide. Alignment in the Z-direction is enabled by enforcing contact between the surfaces 148 and 175 (or standoffs therebetween) that have been formed with precise tolerancing.

The stacked arrangement of ICs 110 and 120 enables the respective Z-heights h of each waveguide 130a-n to be determined relative to the upper surface 148 of the layer 140 to within a level of tolerance of deposition thickness, and the alignment of the optical fibers to be controlled relative to the crystal planes and fidelity of the lithography utilized to define the channels 160a-n and the thickness of the layer 170. Hence, the respective placement of the ends of the waveguides 130a-n to the ends of the optical fibers (not shown, but similarly referenced in FIG. 21B) can be controlled based upon the accurate formation tolerances that can be achieved during fabrication of the substrates 135 and 165, and any layers (e.g., layers 140 and 170) formed thereon, of ICs 110 and 120. The respective placement of the ICs 110 and 120 in the Z-direction can be further controlled by utilizing a standoff(s) (spacer(s)) between the layer 140 and the layer 170, as further described herein.

As further described, stacking of the IC 120 on the IC 110 can be performed in a wafer bonding tool (e.g., an automated die/flip chip bonder) which is able to control alignment tolerance in the micrometer range (e.g., ±0.5 µm placement accuracy, ±1 µm post-bond accuracy is commonplace with such tools).

Figure 2:
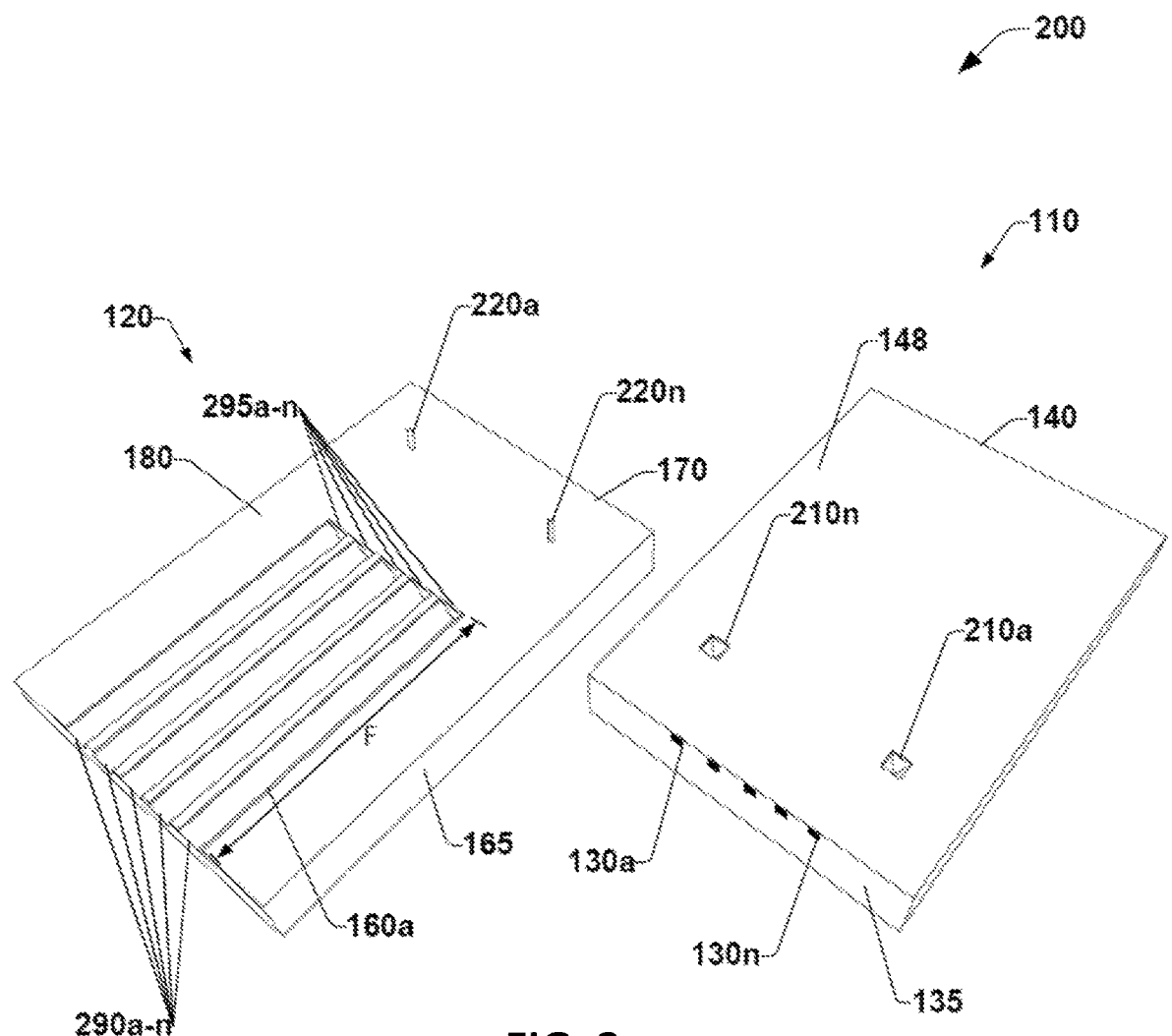
FIG. 2 illustrates a first IC and a second IC respectively including kinematic pins and sockets, according to an embodiment.

Further, alignment accuracy of the ICs 110 and 120 in the X- and Y-directions can be achieved through the use of kinematic pins (posts) and sockets (recesses). FIG. 2 illustrates a configuration 200 comprising ICs utilizing kinematic pins and sockets. The IC 110 (socket die) is fabricated with a plurality of sockets 210a-n formed thereon such that they extend from the external surface 148 of the layer 140 into the underlying substrate 135. FIG. 2 further illustrates the IC 120 (pin die) having a plurality of pins 220a-n located on the external surface 180 of the layer 170. As further described, each pin in the plurality of pins 220a-n can be respectively located in a corresponding socket in the plurality of sockets 210a-n, wherein location of an end (distal end) of a first pin in a first socket and location of a second pin in a second socket acts to anchor the ICs 110 and 120 in the X- and Y-directions, which in combination with the accuracy of positioning facilitated in the Z-direction (as previously described) facilitates positional accuracy of the ICs 110 and 120 relative to each other, and further facilitates alignment of an optical fiber (e.g., any of optical fibers 2110a-n) with a waveguide (e.g., any of waveguides 130a-n). As shown, the channels 160a-n have respective first ends 290a-n located at the end of the substrate 165, and second ends 295a-n located at a distance F along the surface 180 and substrate 165 of the IC 120.

Figure 3:
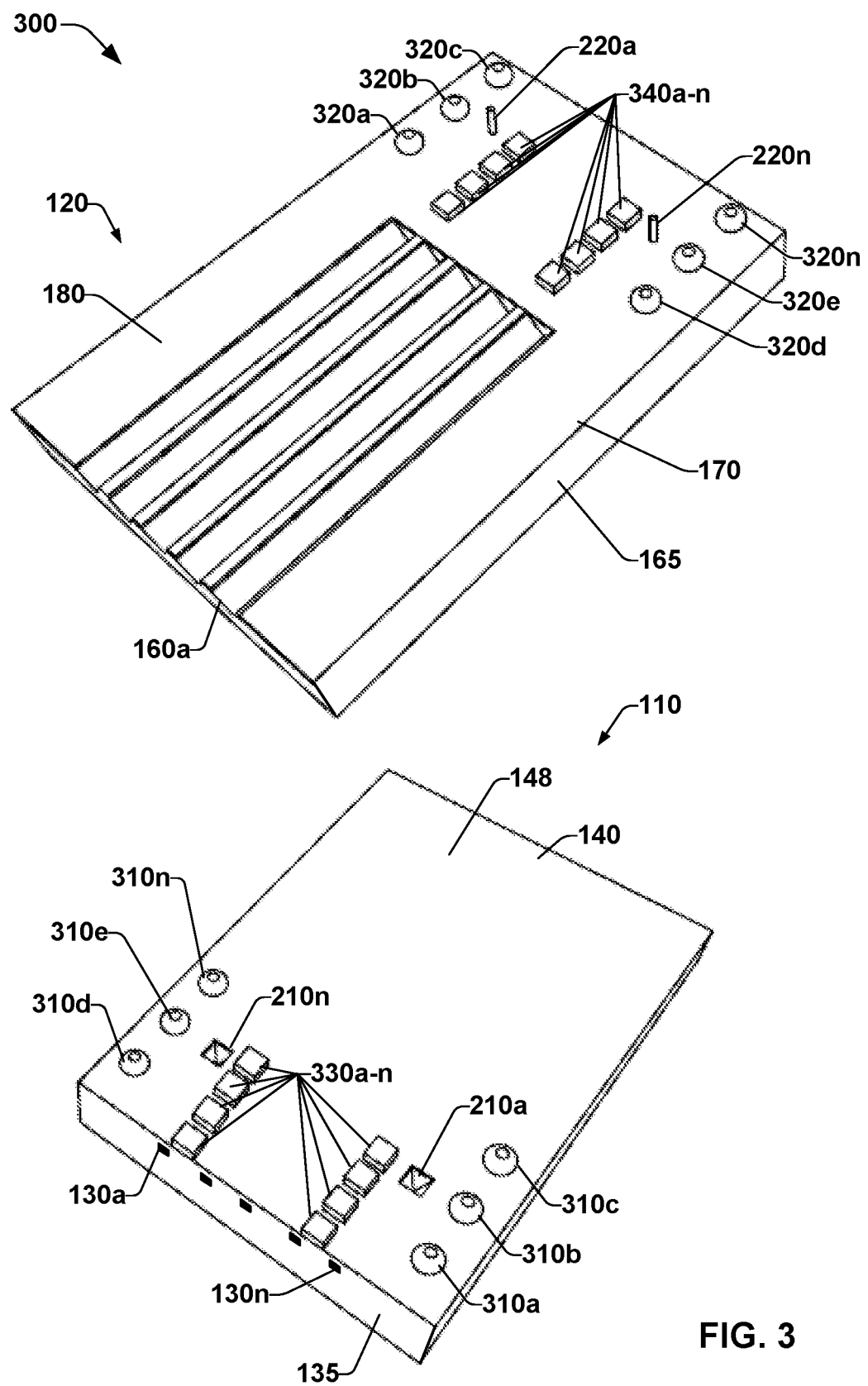
FIG. 3 illustrates a first IC and a second IC respectively including standoff and connectors, according to an embodiment.

Turning to FIG. 3, as shown in configuration 300, the ICs 110 and 120 can be respectively configured to further include a plurality of electrical connectors, wherein a first plurality of connectors 310a-n are located on the external surface 148 of IC 110 and a second plurality of connectors 320a-n are located on the external surface 180 of IC 120. In an embodiment, the connectors 310a-n and 320a-n can be "bumps" formed from a conductive malleable material, e.g., indium (In). During bonding of the ICs 110 and 120 (e.g., in the Z-direction) the connectors 310a-n and 320a-n can fuse together and deform (squish) in the Z-direction. The connectors 310a-n and 320a-n can respectively combine to form electrical contacts (electrical pathways) and/or mechanical contacts between the IC 110 and the IC 120, as required. It is to be appreciated that the connectors 310a-n can also be utilized to secure the IC 110 to the IC 120, accordingly, one or more of the connectors 310a-n can be formed from a material that is nonconductive and functions to provision attachment of the IC 110 to the IC 120.

Owing to a degree of uncertainty in an amount of deformation (displacement in the Z-direction) the connectors 310a-n and 320a-n undergo during location of the IC 110 and the IC 120, hard standoffs (e.g., spacers) 330a-n and 340a-n can be respectively located on the external surface 148 of IC 110 and the external surface 180 of IC 120. The standoffs 330a-n and 340a-n can be fabricated to control the end (termination) of respective motion (Z-translation) of the IC 110 and the IC 120 in the Z-direction, wherein the accurate machining tolerances that can be applied to the standoffs 330a-n and 340a-n further define the Z-direction positioning of the ICs 110 and 120 to a deposition level of accuracy. Accordingly, the standoffs 330a-n and 340a-n can be fabricated with a similar degree of dimensional accuracy (tolerance) as applies to the layers 140 and 170.

Figure 4:
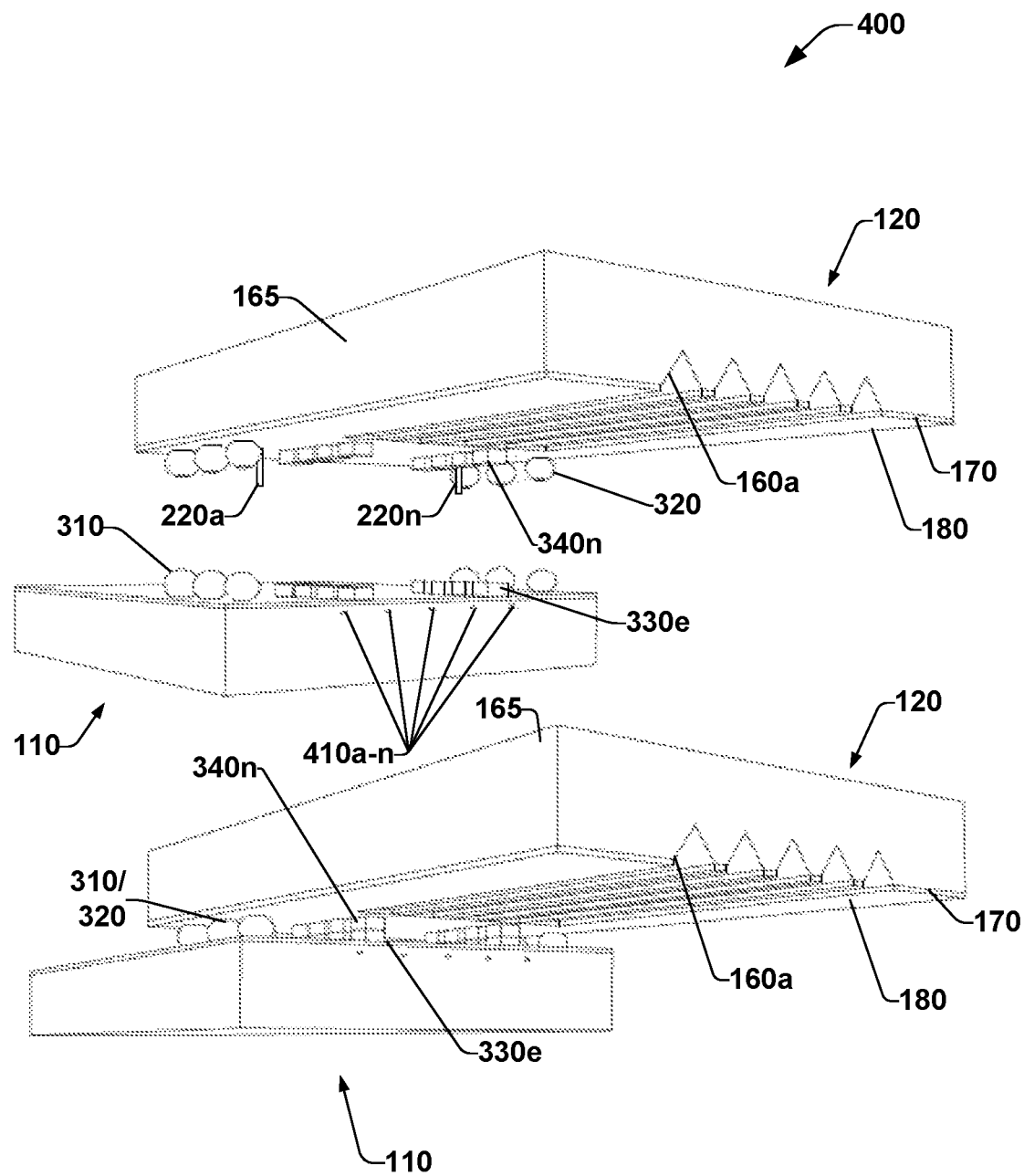
FIG. 4 illustrates a first IC and a second IC being integrated, according to an embodiment.

FIG. 4, configuration 400, illustrates an exemplary embodiment of the IC 110 being integrated with the IC 120. As shown, and further described, during integration of the IC 110 and the IC 120, the pins 220a-n locate in the respective socket in the plurality of sockets 210a-n, thereby acting to guide the alignment of the IC 110 with the IC 120 (and further the respective connectors 310a-n and 320a-n, and the respective standoffs 330a-n and 340a-n) such that the ends 410a-n of the waveguides 130 a-n are correctly positioned relative to the ends 190a-n of the channels 160a-n. Hence, comparing FIG. 4 with FIGS. 21A and 21B, effectively the same IC configurations are utilized, however the configuration 2100 has the ICs arranged in series, while in the configuration 400 the ICs 110 and 120 are in a stacked arrangement.

Figure 5A:
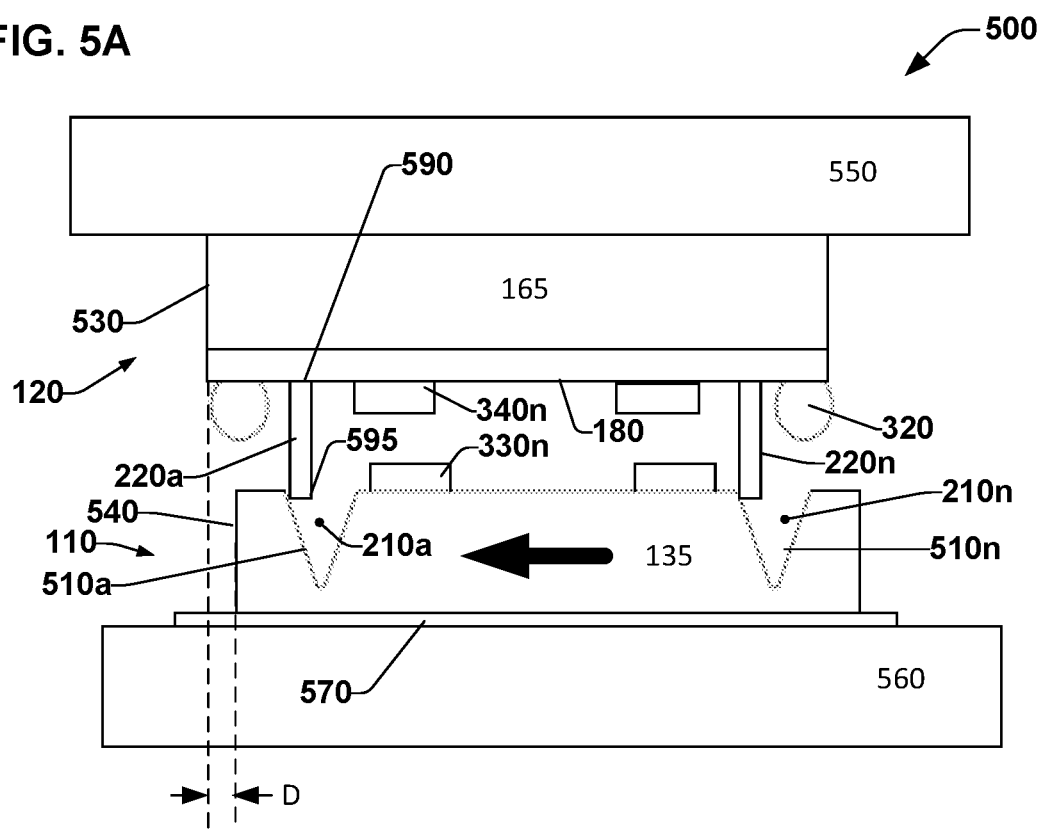
FIG. 5A illustrates a first IC and a second IC initially positioned during a kinematic alignment operation, according to an embodiment.
Figure 5B:
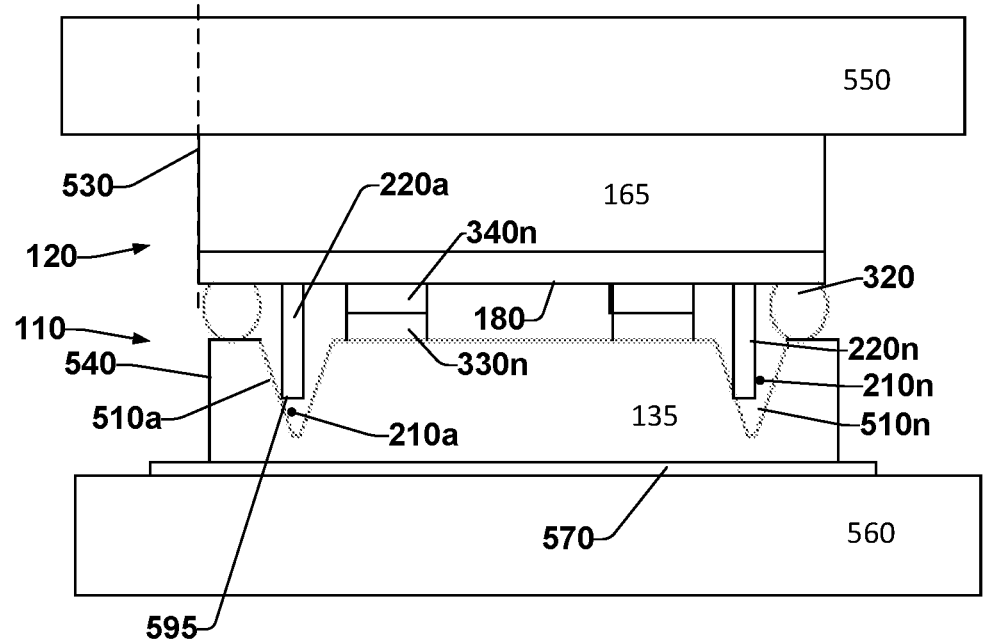
FIG. 5B illustrates a first IC and a second IC positioned during a final stage of a kinematic alignment operation, according to an embodiment.

The alignment of the IC 110 and the IC 120 in the Z-direction (and also in the X- and Y-directions) during integration of the ICs can be facilitated by the respective sockets 210a-n being formed (fabricated) with at least one sidewall of each socket 210a-n being sloped (inclined) such that a socket can have the form of an inverted pyramid, wherein the at least one wall of each socket converges from an opening at the exterior surface 148 to an apex in the substrate 135. FIGS. 5A and 5B, configuration 500, illustrate the IC 120 being lowered towards the IC 110, wherein a pin 220a is being located within a socket 210a, and a pin 220n is being located within a socket 210n. FIG. 5A illustrates alignment of the IC 120 with the IC 110 during initial contact of a pin(s) 220 with a socket(s) 210, and FIG. 5B illustrates alignment of the IC 120 with the IC 110 at Z-stop contact of a pin(s) 220 with a socket(s) 210. As shown, during bonding between the IC 120 and the IC 110, when the respective pin makes contact with the sloped sidewall of the respective socket (e.g., pin 220a and a sidewall 510a of the socket 210a, and pin 220n and a sidewall 510n of the socket 210n), the socket die IC 110 can translate in the X-Y plane to facilitate alignment of the respective centers of the pins and sockets. For example, as shown in FIG. 5A a reference edge 530 of the IC 120 is offset by a distance D from a corresponding reference edge 540 of the IC 110. During displacement of the IC 120 in the Z-direction, interaction of the pins 220a-b and the socket sidewalls 510a-b cause the IC 110 to be displaced in the X-Y plane such that, as shown in FIG. 5B, the reference edges 530 and 540 are in alignment. In an embodiment, the ICs 110 and 120 can be respectively located on an upper platen 550 and a lower platen 560 of a wafer bonding tool (not shown in entirety), wherein motion of the platens 550 and 560 relative to each other in the Z-direction causes the IC 110 to be integrated with the IC 120. To facilitate lateral (X-Y plane) motion of the IC 110 during the integration operation, the IC 110 can be located on a layer 570 comprising low friction (compliant) material layer. The low friction material layer 570 can be formed from any suitable material, e.g., wax (heated during bonding to flow), oil, petroleum jelly, or any compliant adhesive capable of lateral translation with force less than a sheer force of pins 220a-b. As shown in FIGS. 5A and 5B, the pin 220a has a proximate end 590 located at the external surface 180 of the IC 120, and a distal end 595. During vertical motion of the IC 120 relative to the IC 110, the distal end 595 of the pin 220a interacts (touches) the sidewall 510a of the socket 210a causing the IC 110 to move in the X-Y plane, wherein the IC 110 is self-aligned with the IC 120 (per FIG. 5B). The number of pins 220a-n (and corresponding sockets 210a-n) that are utilized can be a function of a force acting in the X-Y plane required to shift the IC 110 laterally, e.g., the number of pins 220a-n have a cumulative shear force that is greater than the lateral force required in the X-Y plane.

Figure 6:
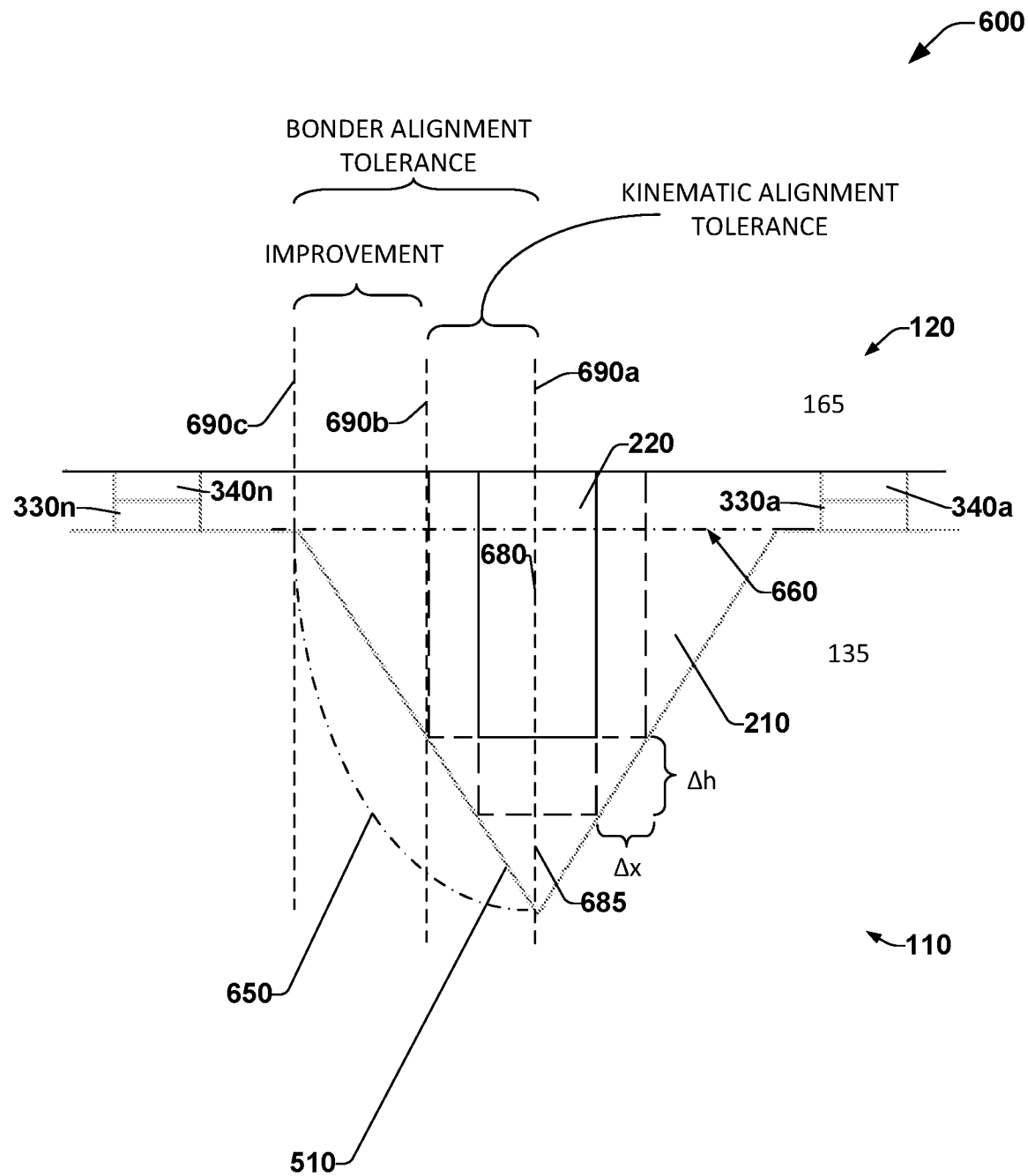
FIG. 6 presents a schematic of a pin located in a socket, and the various alignment tolerances associated therewith, according to an embodiment.
Figure 7:
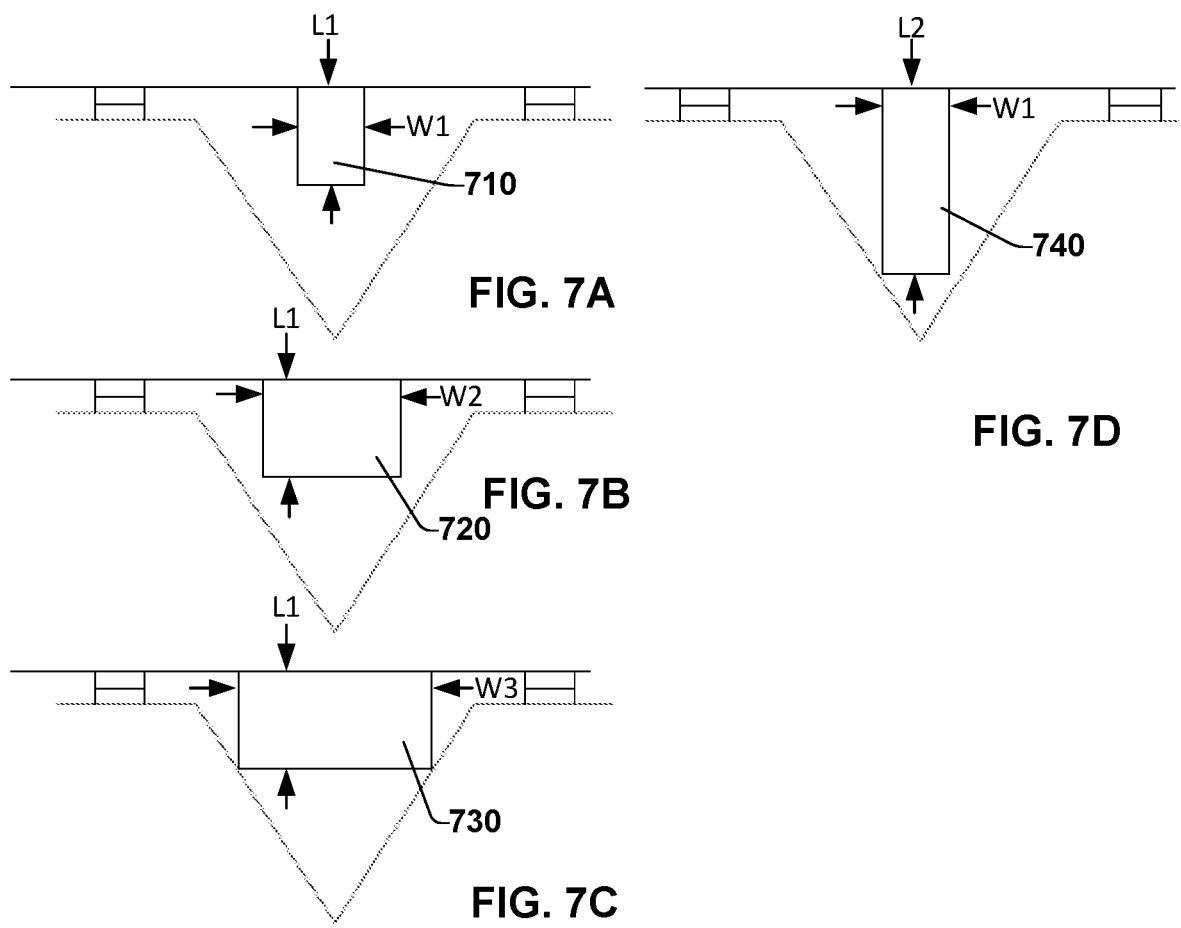
FIGS. 7A, 7B, 7C, and 7D present schematics indicating pin location as a function of aspect ratio, according to an embodiment.

FIG. 6 presents a schematic 600 of a pin 220 located in a socket 210. As previously mentioned a socket can be formed with one or more sloping sidewalls, wherein the number of sidewalls forming a socket can be based upon the structure of the socket, e.g., a three-sided pyramid, a four-sided pyramid, an n-sided pyramid, a domed-shaped pyramid having a curved (e.g., parabolic, elliptical, etc.) sidewall(s), etc. The sockets 210*a-n* can be formed with any suitable shape to facilitate interaction with a respective pin 220*a-n* to enable self-alignment (kinematic alignment) of the IC 110 with the IC 120. In an embodiment, the substrate 135 (and layer 140) can be formed from a silicon-based material, such that potassium hydroxide (KOH) etching in silicon (e.g., Miller index 100) forms sockets having a natural pyramidal form, with the sidewalls (e.g., sidewall 510*a-n*) having a slope of 54 degrees, making a natural socket with an opening 660 on the upper surface of IC 110. However, other materials which are not amenable to such a crystallographic etch can utilize an anisotropically etched socket (e.g., as denoted by broken line 650). Assuming the opening 660 of the socket 210 is aligned on a bonding tool platen (e.g., platen 560) to the tolerance of the wafer bonding tool (e.g., ±0.5 µm, as previously mentioned), as the pin 220 moves downward in the Z-direction, the respective centers (center 680 of the pin 220, center 685 of the socket 210) of the pin and the socket can move towards each other. Accordingly, the various embodiments presented herein facilitate an alignment tolerance (e.g., minimizing the distance D) that is fixed (controlled) by the physical geometry of the parts (e.g., as lithographically dimensioned), e.g., for a pin of a certain height and width, in a socket of a given shape and size, the maximum possible tolerance between the center 680 of the pin 220 and the center 685 of the socket 210 are known. Furthermore, for known sidewall profiles, the improvement in X-Y tolerance with Z-translation is a fixed ratio, as depicted by Δh:Δx in FIG. 6. As shown by lines 690*a*, 690*b* and 690*c*, the width of the pin 220 (e.g., distance between lines 690*a* and 690*b*) in combination with the angle of the sidewall 510 enables an improved alignment tolerance (distance between lines 690*b* and 690*c*) to be achieved than what can be achieved by the wafer bonding tool (distance between lines 690*a* and 690*c*).

FIGS. 7A-D present respective schematics illustrating how the aspect ratio of a pin (e.g., height (L) of the pin vs. width (W) of the pin) does not need to have a high value in order for the various embodiments presented herein to achieve perfect alignment. Pins 710-730 (FIGS. 7A-C, similar to pins 220*a-n*) illustrate that a low aspect pin can enable alignment of ICs 110 and 120 in a similar manner to that enabled by a high aspect pin (e.g., pin 740), e.g., as the width of the respective pin increases from W1-W3, for a constant length L1, the respective pin can still facilitate alignment of the ICs 110 and 120. Hence, a low aspect pin (e.g., pin 730) can effect alignment in a similar manner to a high aspect pin (e.g., pin 740 having width W1, and a length L2). Any of pins 710-740 can be considered to be equivalent to a pin 220, e.g., with regard to fabrication, composition, operation, placement, etc.

Figure 8:
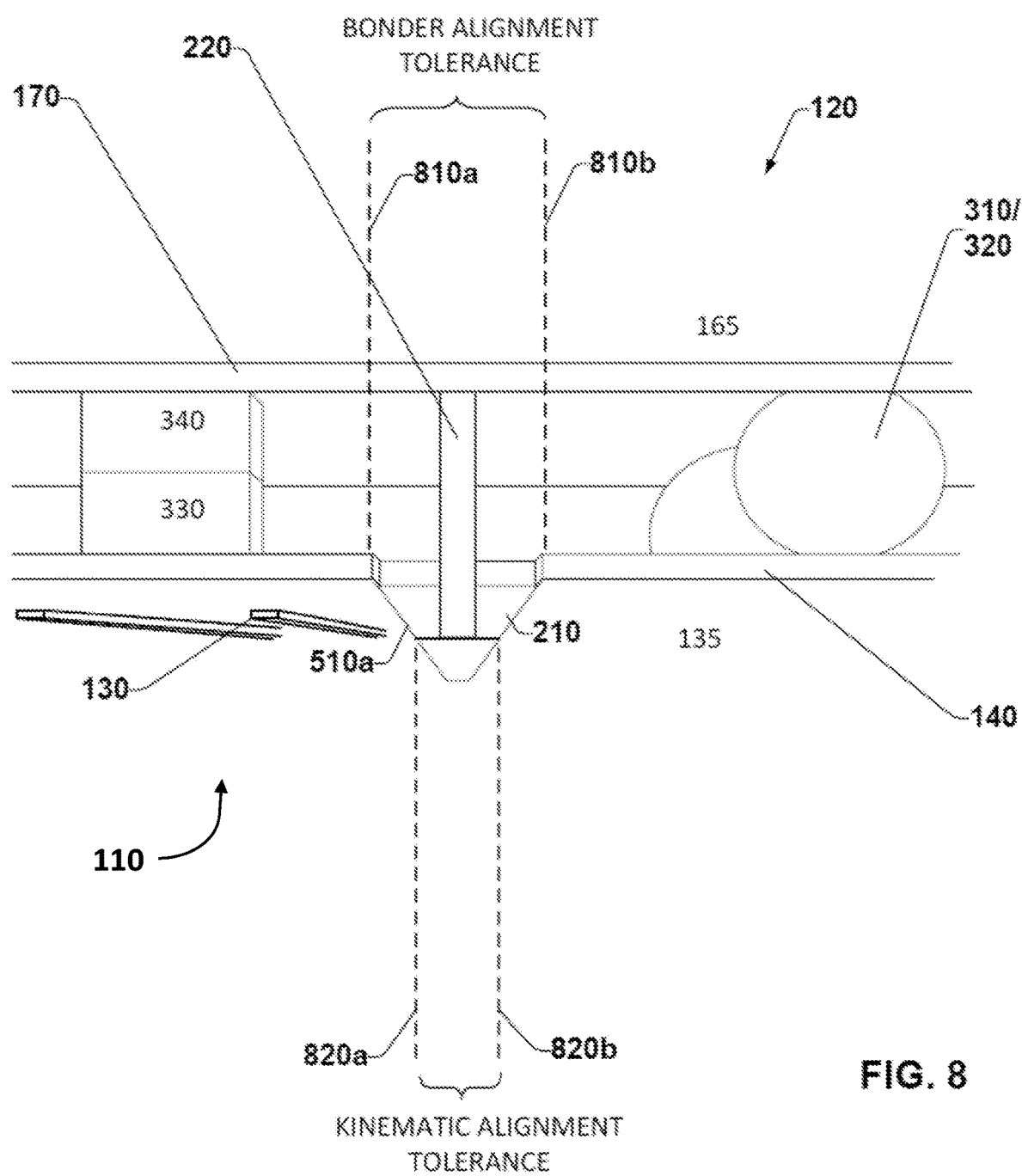
FIG. 8 presents a sectional view of a pin location in a socket, according to an embodiment.

FIG. 8, configuration 800, presents a cross section schematic of the IC 110 bonded with the IC 120. The position of the two ICs 110 and 120 are defined in the Z-direction by the rigid contact between the two standoffs 330 and 340. The two separate indium bumps 310 and 320 are fused together to form a single bump (which may have expanded in the X- and Y-directions, effect not shown). Further, the pin 220 resides in the socket 210. Lines 810*a* and 810*b* indicate the positional tolerance (alignment accuracy) that is achievable by the wafer bonding tool, while lines 820*a* and 820*b* indicate the positional tolerance (alignment accuracy) that is achievable by the pin 220 kinematically interacting with the socket 210. As shown, utilizing the pin 220 and the socket 210 enables the IC 110 to be aligned to the IC 120 with a higher degree of accuracy than is achievable by the wafer bonding tool alone.

Figure 9:
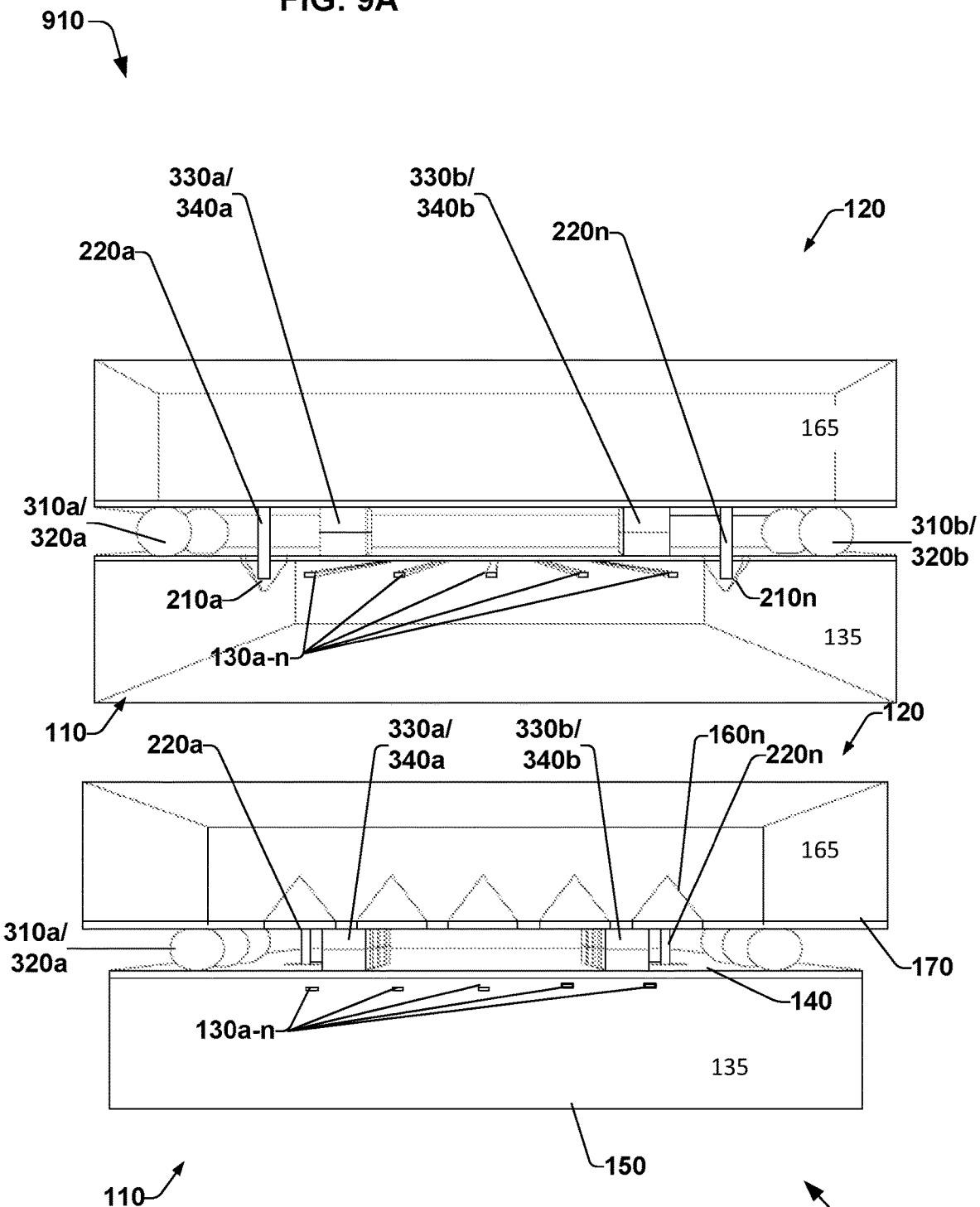
FIG. 9A presents a sectional view of a first IC integrated with a second IC, according to an embodiment.
FIG. 9B presents a sectional view of a first IC integrated with a second IC, according to an embodiment.

FIGS. 9A and 9B, configurations 910 and 920, illustrate two further cross section schematics taken at different places along the chip formed by combing ICs 110 and 120. FIG. 9A illustrates a section exposing pins 220*a* and 220*n* respectively located in sockets 210*a* and 210*b*, with sections through waveguides 130*a-n* embedded in the substrate 135. FIG. 9B illustrates an end view along the channels 160*a-n* in the substrate 165 and the sidewall 150 with the ends of the waveguides 130*a-n* visible. As is readily apparent in FIGS. 9A and 9B, the ICs 110 and 120 are positioned in the Z-direction based upon the fabrication tolerances applicable to the dimensioning of the standoffs 330 and 340, the layers 140 and 170, the pins 220, the sockets 210, etc. Further, the location of the pins 220*a-n* in the plurality of sockets 210*a-n*, facilitates precise alignment in the X- and Y-plane. Accordingly, the channels 160*a-n* are precisely aligned in accordance with the ends of the waveguides 130*a-n*.

Figure 10:
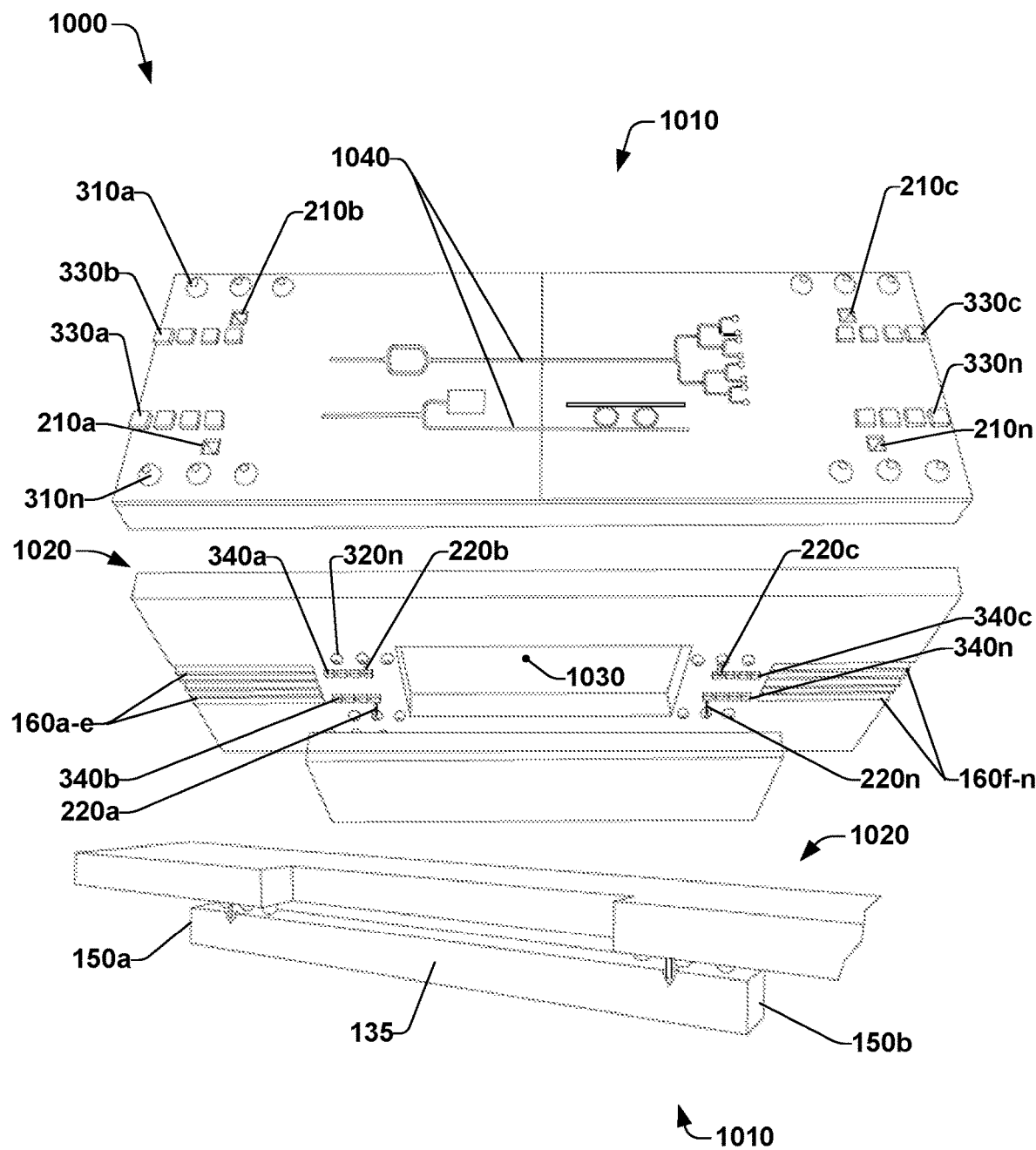
FIG. 10 presents respective views of a photonics IC integrated with an optical fiber IC, according to an embodiment.

In one or more applications, it may be necessary for both input and output fibers to be available for coupling. This can be accomplished by having a monolithic v-groove IC which spans an entire photonics IC (e.g., a silicon photonics IC). FIG. 10, configuration 1000, illustrates such an embodiment, wherein a photonics IC 1010 is integrated with an optical fiber IC 1020. As shown, the fiber IC 1020 can be fabricated to include an opening 1030 (hole, window) that facilitates access to the various components incorporated into the photonics IC 1010. Effectively, the optical fiber IC 1020 is a monolithic chip functioning as two ICs 120 that are stacked on the photonics IC 1010. Accordingly, the optical fiber IC 1020 comprises components included in the IC 120 (as previously described) and further, the photonics IC 1010 comprises components included in the IC 110 (as previously described). As shown, the photonics IC 1010 can include a plurality of sockets 210*a-n*, connectors 310*a-n*, standoffs 330*a-n*, etc., and further, the fiber IC 1020 can include a plurality of channels 160*a-n*, pins 220*a-n*, connectors 320*a-n*, standoffs 340*a-n*, etc.

In an embodiment, the optical fibers (not shown) located in the channels 160*a-e* can be operating as an input side of the integrated circuit 1000 formed from ICs 1010 and 1020, and the optical fibers (not shown) located in the channels 160*f-n* can be operating as an output side of the integrated circuit 1000, or vice-versa. The photonics IC 1010 can further include waveguides and/or associated circuitry 1040, etc., wherein the waveguides can be optically coupled with a plurality of optical fibers (not shown) which are located in the plurality of channels 160*a-n*, as previously described. While not shown in FIG. 10, waveguides (e.g., input and output waveguides) can be incorporated into the substrate 135, with respective ends of the waveguides being present in the sidewalls 150*a* and 150*b* of the substrate 135. Hence, any optical fibers in channels 160*a-n* can be coupled to the waveguide ends, as previously described. Bonding the IC 1010 to the IC 1020 can align the input waveguides and output waveguides to the input and output fiber channels 160*a-n*.

Figure 11:
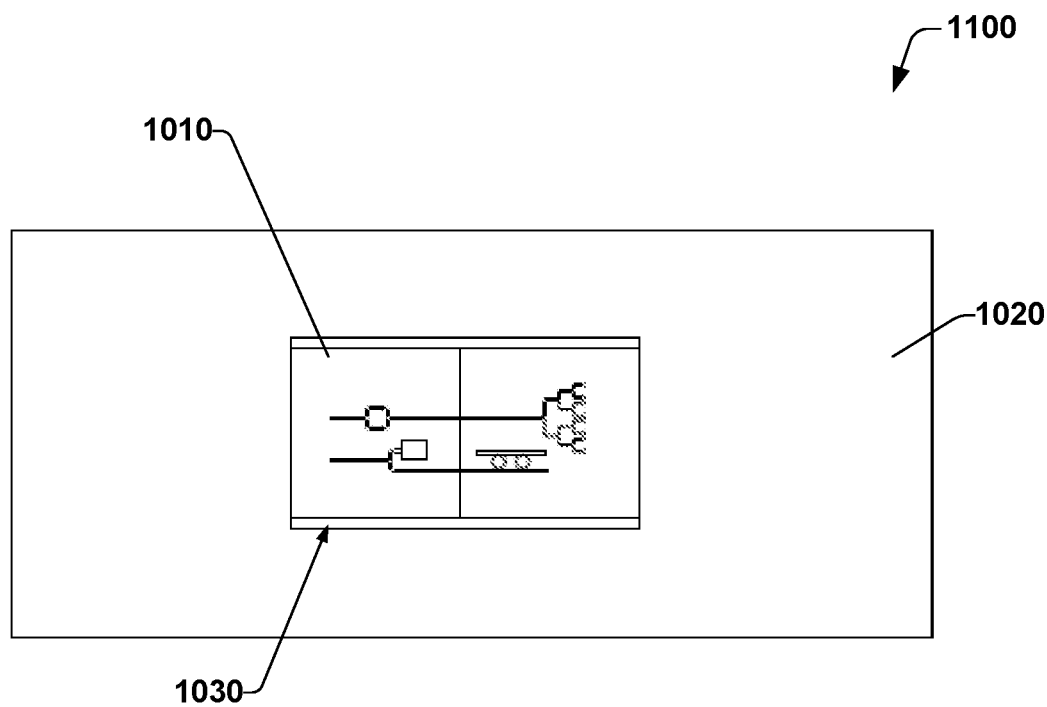
FIG. 11 illustrates a photonics IC integrated with an optical fiber IC, and accessibility of the photonics IC, according to an embodiment.

FIG. 11, configuration 1100, is an overhead schematic illustrating the IC 1010 bonded with the IC 1020, with a portion of the IC 1010 visible/accessible via the opening 1030.

Figure 12:
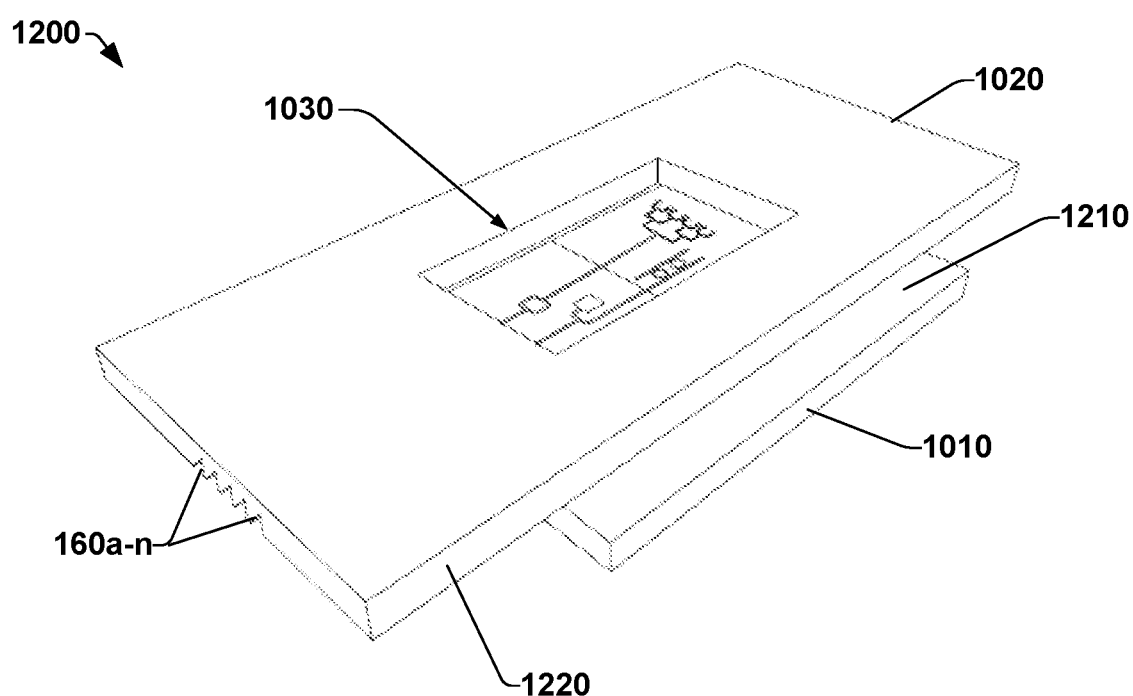
FIG. 12 illustrates a photonics IC integrated with an optical fiber IC, and accessibility of the photonics IC, according to an embodiment.

In various applications, additional access to the photonics IC 1010 may be required (e.g., high speed connections, etc.). FIG. 12, schematic 1200, illustrates an IC 1010 having a side(s) 1210 that extends beyond an edge 1220 of the IC 1020 to facilitate access of the photonics IC 1010, e.g., via circuitry present on the side(s) 1210 (not shown).

Figure 13:
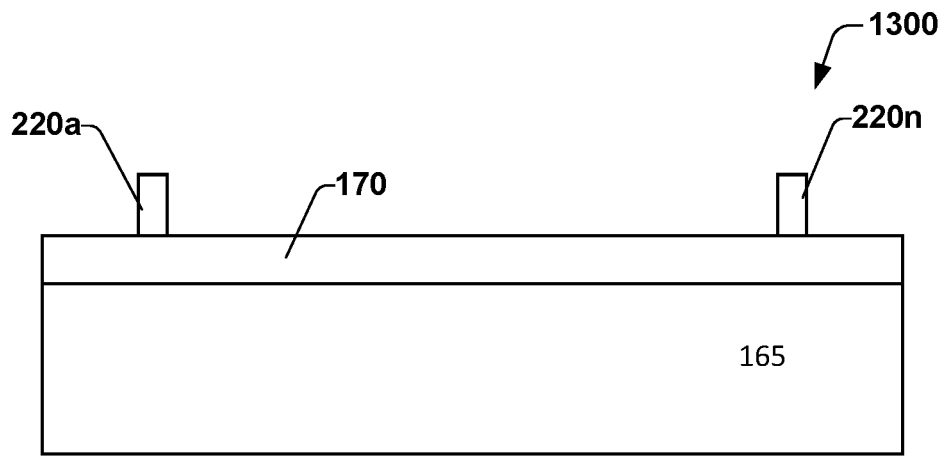
FIGS. 13, 14, and 15 illustrate respective ICs and kinematic pins formed thereon, according to an embodiment.
Figure 14:
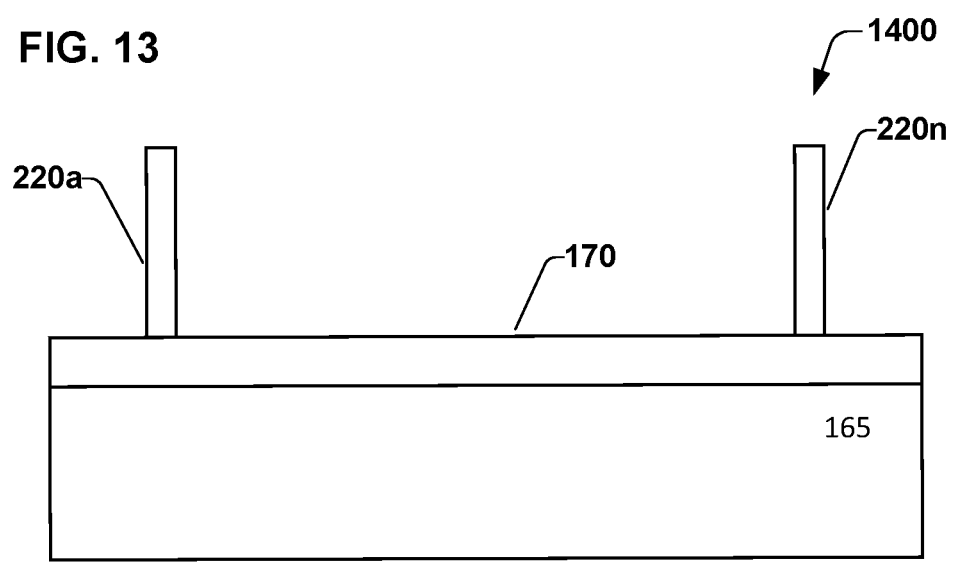
Figure 15:
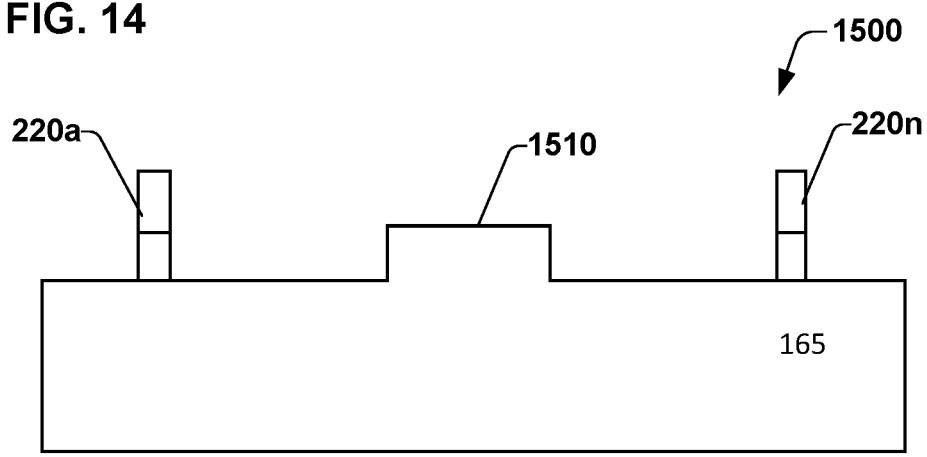

FIGS. 13-15 illustrate respective embodiments 1300, 1400, and 1500 for fabricating the pins (e.g., pins 220*a-n*). In an embodiment comprising a silicon v-groove chip (e.g., configurations 1300 and 1400), the respective pins 220*a-n* can be defined lithographically and registered to centers of the channels 160*a-n* at the tolerance level of lithography process (e.g., dimensional and positional accuracy/tolerancing is deep sub-μm). Per FIG. 13, the pins 220*a-n* can be fabricated (e.g., deposited or, spun-on, lithographically defined, etc.) from an oxide, nitride, metal, ceramic, an epoxy resin, a hardened epoxy resin, benzocyclobutene (BCB), or other suitable material. Per FIG. 14, the pins 220*a-n* can be formed from tungsten (W), or any other suitable material, e.g., the tungsten is molded tungsten that is deposited onto the layer 170. Owing to differences in fabrication, the oxide-based pins of FIG. 13 can be utilized in an embodiment that requires low clearance pins (e.g., about 1-2 μm), while the W-based pins of FIG. 14 can be utilized in an embodiment that requires/tolerates long clearance pins, (e.g., from about 2-10 μm). The layer 170 can be formed from any suitable material, e.g., $Si_3N_4$.

FIG. 15 illustrates an InP DFB laser 1500, wherein the pins 220*a-n* can be defined during an etching operation utilized to define the ridge laser 1510. Accordingly, the pins are registered to the center of the DFB laser 1500 at the level of e-beam accuracy (e.g., dimensional and positional accuracy/tolerancing is on the order of nanometers). By co-forming the ridge laser 1510 with the pins 220*a-n*, the pins 220*a-n* are self-aligned (registered) with the ridge laser 1510, wherein the self-aligning can occur at the masking fabrication process. The co-forming operation prevents the error inherent in a system where the pins 220*a-n* are made as a separate fabrication process to the ridge laser 1510, e.g., fabrication error can be introduced when the ridge laser 1510 is formed first, and the pins 220*a-n* are formed later, as a separate process. In an embodiment, a InP DFB laser 1500 (e.g., a III-V laser) can be aligned and coupled with a waveguide(s) 130*a-n* to facilitate transmission of light from the laser into the waveguide(s).

Figure 16A:
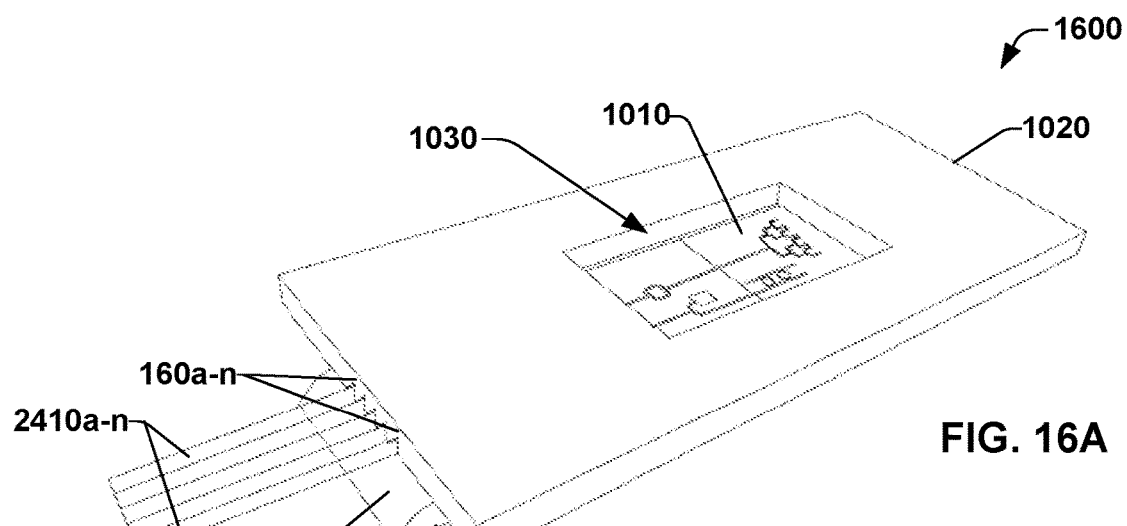
FIGS. 16A, 16B, and 16C illustrate respective views of a clamping device being utilized to locate a plurality of optical fibers in a pair of stacked ICs, according to an embodiment.
Figure 16B:
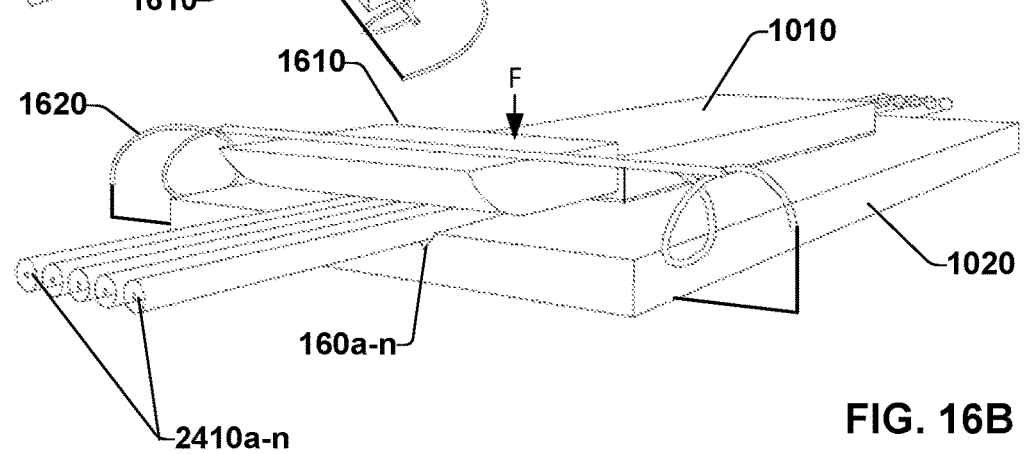
Figure 16C:
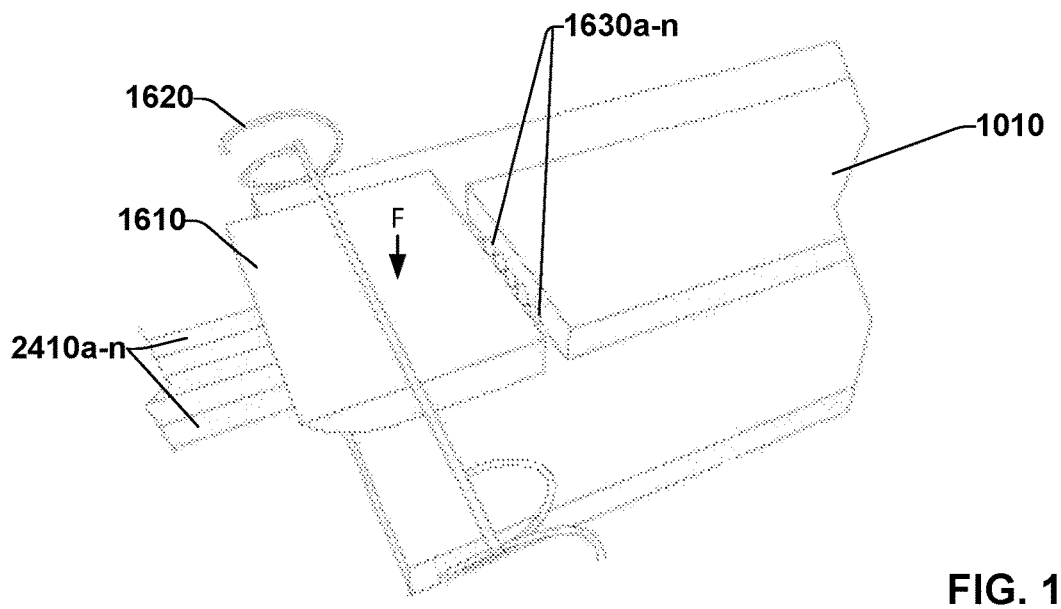

FIGS. 16A-C respectively illustrate three views of a configuration 1600 which can be utilized to secure (locate, retain, constrain) the optical fibers 2140*a-n* in the channels 160*a-n* of the IC 1020 relative to the IC 1010. Configuration 1600 illustrates the plurality of optical fibers 2140*a-n* being utilized in combination with the IC 1010 bonded with the IC 1020. To facilitate the optical fibers 2140*a-n* being secured in the channels 160*a-n*, a clamping device (or other pressure application device) comprising a clamp plate 1610 and a spring bar 1620 can be utilized to hold and apply pressure (e.g., the directional force F shown in FIGS. 16B-C) upon the optical fibers 2140*a-n* such that the respective ends 1630*a-n* of the optical fibers 2140*a-n* are aligned (axially) and proximate to the ends (not shown) of the waveguides 130*a-n* incorporated in the IC 1010. It is to be appreciated that while the configuration 1600 illustrates a clamp plate 1610 and a spring bar 1620 being utilized with the ICs 1010 and 1020, a similar combination of clamp plate 1610 and spring bar 1620 can be utilized to secure the optical fibers 2140*a-n* with a configuration comprising the ICs 110 and 120, or any other suitable arrangement. Further, while the configuration 1600 illustrates a clamp plate 1610 and a spring bar 1620 being utilized to hold the optical fibers 2140*a-n* in the channels 160*a-n*, any suitable clamping device/structure (e.g., a clothes pin spring) can be utilized to secure the optical fibers 2140*a-n* in the respective channels 160*a-n*. Further, the optical fibers 2140*a-n* can be held in place by application of a foam or other material, e.g., applying isotropic pressure to the optical fibers 2140*a-n*.

It is to be appreciated that while the various embodiments presented herein utilize a pin located in a socket, other structures for location and alignment can be utilized. For example, rather than a pin and socket structural arrangement being utilized, the pin can be replaced with a blade and the socket can be replaced with a channel structure such that the blade can be positioned in the channel (e.g., constrained in the X-direction) while being able to slide along the channel (e.g., freedom of movement in the Y-direction). Similarly, a pin and channel arrangement can be utilized, wherein the pin can be positioned in the channel (e.g., constrained in the X-direction) while being able to slide along the channel (e.g., freedom of movement in the Y-direction). Further, while not shown, the respective ends of an optical fiber and a waveguide can be separated by an air gap, or the gap between the ends can be filled with a couplant (e.g., an index-matching fluid, gel, epoxy resin, etc.).

It is to be further appreciated that while the pins 220*a-n* are illustrated in the various embodiments presented herein as having straight-sided sidewalls, the sidewalls can be formed with any desired shape (e.g., parabolic) in accordance with the embodiments presented herein. And further, the sidewalls 510*a-n* of the sockets 210*a-n* can have any desired shape/profile, e.g., as a function of design, substrate material, fabrication technology, etc.

It is also to be appreciated that while the various embodiments presented herein relate to waveguide and optical fiber ICs (and various features/components/devices incorporated therewith) being respectively aligned by pins interacting with sockets, the various embodiments can be applied to alignment of any IC devices/structures where a high degree of positional accuracy is desired (e.g., kinematic interaction between a pin(s)/socket(s) enables positional accuracy to be achieved that is better than what can be achieved by a wafer bonding tool alone). For example, while ICs 110 and 120 are utilized to align a waveguide (e.g., any of waveguides 130*a-b*) with a respective channel (e.g., respective channel 160*a-n*) to facilitate an optical fiber (e.g., respective optical fiber 2410*a-n*) being aligned with the waveguide, the ICs 110 and 120 can include any respective features/devices/components that are to be respectively aligned with each other.

Figure 17:
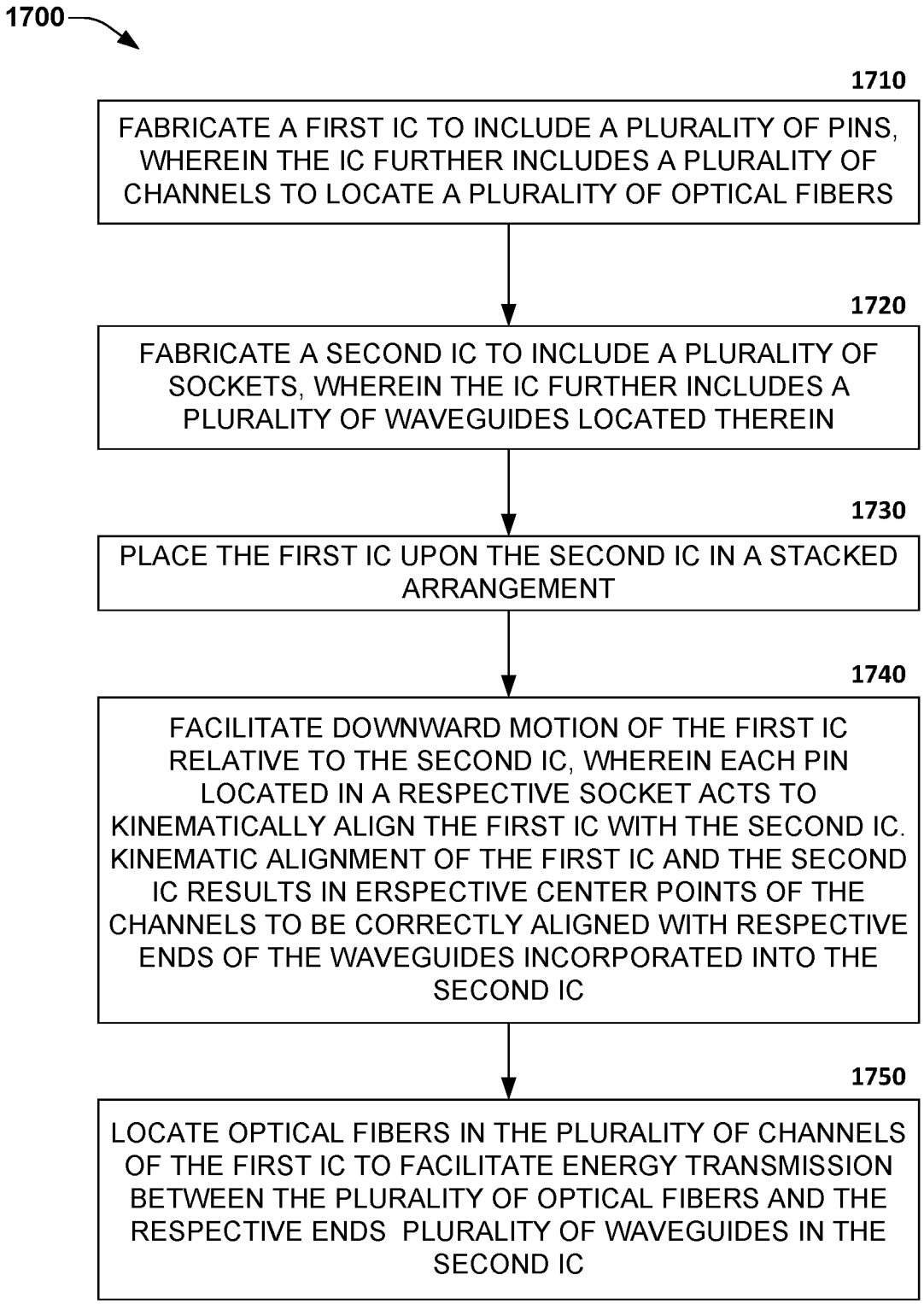
FIG. 17 is a flow diagram illustrating an exemplary methodology for integrating a plurality of ICs.

FIG. 17 is a methodology 1700 relating to locating and aligning respective ICs (dies) to facilitate alignment of waveguides and optical fibers to maximize optical coupling therebetween. While the methodology 1700 is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

At 1710, a first IC (first die) is fabricated, wherein the first IC comprises an array of channels (e.g., v-grooves) which can be respectively utilized to locate and align a plurality of optical fibers. The first IC can be further formed to include a plurality of pins, wherein the pins can be utilized to kinematically align the first IC, and the channels. The first IC can be fabricated to also include at least one first standoff (e.g., a pad of known thickness) and/or at least one first connector (e.g., an indium bump).

At 1720, a second IC (second die) is fabricated, wherein the second IC has a plurality of waveguides incorporated therein (e.g., Si waveguides in a Si-based substrate). The second IC can be further fabricated with a plurality of sockets formed such that the plurality of sockets open to an external surface. The plurality of sockets can have sloped sidewalls which extend into the substrate to join at a common point thereby forming a socket having a pyramidal configuration, wherein the common point is the apex of the pyramid, and the opening of the socket is the pyramid base. The respective sockets and pins can be sized to facilitate location of the pins in the sockets thereby enabling location and alignment of the first IC and second IC in the X- and Y-directions. The second IC can be fabricated to also include at least one second standoff (e.g., a pad of known thickness) and/or at least one second connector (e.g., an indium bump). Each of the first and second standoffs can be positioned on their respective ICs such that when the two ICs are integrated, the first and second standoffs abut each other. Further, each of the first and second connectors can be positioned on their respective ICs such that when the two ICs are integrated, the first and second connectors abut each other and undergo deformation to form an electrical contact between the first IC and the second IC.

At 1730, the first IC can be located upon the second IC (e.g., the first IC is inverted upon the second IC such that the respective pins of the first IC can be located in the respective sockets of the second IC. As previously described, the first IC and second IC can have structures that respectively include a layer formed (e.g., deposited) upon a substrate. Deposition and formation of the respective layers can be tightly controlled such that a thickness of each IC (e.g., die thickness) can be known with a high degree of accuracy (e.g., nanometer precision), and further a position of a center point of an optical fiber when located in a channel and a position of an end of a waveguide from an external surface of a layer formed on the second IC. Hence, when the first IC is in a final position relative to the second IC (e.g., as controlled by the first and second standoffs), the alignment of the first IC and the second IC is constrained in the Z-direction.

At 1740, downward motion of the first IC relative to the second IC is facilitated. In an embodiment, the first IC can be located on a first platen (upper platen) of a wafer bonding tool and the second IC can be located on a second platen (lower platen) of the wafer bonding tool. Downward motion (either gravitational, powered) of the first IC can cause the second IC to move in the X- and Y-planes as the respective pins interact (e.g., slide down) with the sloped walls of the sockets. The first IC can move vertically relative to the second IC until a final position is reached as defined by the first and second standoffs abutting each other. As previously mentioned, during integration of the first IC with the second IC, the first connector and the second connector can combine (e.g., deformationally joined) to form a single electrical connection between the first IC and the second IC.

At 1750, an optical fiber can be located in each of the channels formed in the first IC, wherein a first end of the optical fiber can be positioned to abut an end of a waveguide located in a sidewall of the second IC to facilitate energy transmission (e.g., light energy) between the optical fiber and the waveguide. Owing to the vertical location (e.g., in the Z-direction) of the central position of the end of the optical fiber being precisely controlled (and known) as a function of the fabrication tolerances of the channels and layers of the first IC, and further, the central position of the waveguide end in the sidewall of the second IC, the optical fiber can be accurately positioned in the Z-direction relative to the end of the waveguide. The accurate positioning of the optical fiber relative to the end of the waveguide can be further controlled by the thickness of the first and second standoffs. Further, the alignment of the end of the optical fiber relative to the end of the waveguide can be controlled in the X- and Y-planes based upon the interaction (e.g., constraint) of the respective pins located in the respective corresponding sockets. Hence, per the foregoing, optical coupling between an optical fiber(s) and a waveguide(s) can be maximized, and further, automated techniques can be utilized during the bonding (integration) of the first IC with the second IC.

The various features and/or layers presented in the foregoing can be formed/deposited by any suitable process such as a thermal processing, phase conversion, spin coating, deposition, CVD process, for example, low pressure chemical vapor deposition (LPCVD), plasma enhanced chemical vapor deposition (PECVD), molecular-beam epitaxy (MBE), liquid-phase epitaxy (LPE), vapor-phase epitaxy (VPE), solid-phase epitaxy (SPE), deposition doping, etc.

Any suitable technique can be used to pattern any of the material layers presented herein. For example, patterning can be created by employing, for example, a photoresist which can be patterned using standard photolithographic techniques to form the sockets, standoffs, etc., wherein the photoresist is exposed to electromagnetic radiation through a mask having an image pattern of a desired layout (e.g., desired trenches, openings, line patterning, etc.). Openings are then formed in the photoresist, and subsequently the membrane layer, in order to form the desired layout, e.g., by etching away the exposed material (in the case of a positive photoresist) or etching away the unexposed material (in the case of a negative photoresist). Depending on the material of the photoresist, exposure can create a positive or a negative. With a positive photoresist, exposure causes a chemical change in the photoresist such that the portions of the photoresist layer exposed to light become soluble in a developer. With a negative photoresist, the chemical change induced by exposure renders the exposed portions of the photoresist layer insoluble to the developer. After exposure and development, an opening according to the desired pattern is formed in the membrane layer. A subsequent processing step, such as a deposition step, an etching step, etc., can be performed and controlled according to the opening. The photoresist can be subsequently removed. Etching can be by any viable dry or wet etching technique. For example, a wet or dry etching technique can be employed for patterning, while in another aspect, etching can be by a specific anisotropic etch.

Any etching/material removal technique is applicable to the various embodiments, as described herein. Wet etching can be utilized to remove a particular layer (e.g., when forming a socket, a pin, etc.) where a given layer may be susceptible to etch by a particular etchant while a neighboring layer is not (e.g., selective etching). In another example, anisotropic etching techniques can be utilized to control material removal in a specific direction.

Levelling of layers after formation can be by any suitable technique, e.g., by CMP or other suitable process, to achieve a given dimension, in preparation for the next stage in creation of the 3D structure.

Stripping of a resist layer involves the removal of unwanted resist from the 3D structure, while preventing removal of underlying layers and materials. Any suitable stripper can be utilized as required, such as organic stripper, inorganic stripper, dry stripping, etc. In another example, chemical mechanical polishing or other physical removal process can be used to remove the membrane.

It is to be appreciated that while the formation of the various structures (e.g., ICs 110, 120, 1010, 1020, sockets 210, pins 220, standoffs 230, 240, channels 160, etc.), there may be certain procedures that are not fully disclosed during description of the various embodiments as presented herein. However, rather than provide description of each and every operation involved in the various operations facilitating formation, patterning, removal, etc., of each structure presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by CMP, or other suitable operation) it is considered, for the sake of readability of the various exemplary embodiments presented herein, that the leveling process occurred, as have any other necessary operations. It is appreciated that the various operations, e.g., leveling, CMP, patterning, photolithography, deposition, layer formation, etching, etc., are well known procedures and are not necessarily expanded upon throughout this description.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An integrated circuit (IC) configuration comprising:
   a first chip comprising:
      a pin, wherein the pin extends outward from a first surface of the first chip, the pin has a proximal end located on the first surface of the first chip, a distal end, and a length therebetween such that the distal end is positioned outward from the first surface of the first chip;
      a waveguide located in a first sidewall of the first chip, wherein the first sidewall adjoins the first surface of the first chip, and a first end of the waveguide is located at an exterior surface of the first sidewall; and
      a first conductive pad located on the first surface of the first chip, wherein the first conductive pad comprises a malleable material; and
   a second chip comprising:
      a substrate having an upper surface, the substrate further comprising:
         a channel formed in the upper surface of the substrate and extends along a portion of the upper surface, the channel having a first end located at an edge of the upper surface formed by the upper surface and a second sidewall of the substrate and a second end located at a distance along which the channel extends over the upper surface of the substrate; and
      a socket formed into the substrate, wherein the socket has an inverted pyramidal shape comprising at least three socket sidewalls, at least one sidewall of the socket converges from an opening at the upper surface to an apex in the substrate, wherein the first chip is positioned on top of the second chip such that the distal end of the pin is located within the socket, and the first end of the channel is located in accordance with the location of the first end of the waveguide, and wherein the malleable material is configured to deform during location of the first chip and the second chip to form an electrical path between the first chip and the second chip.

2. The IC configuration of claim 1, further comprising an optical fiber located in the channel, wherein the optical fiber is axially aligned along the length of the channel and a first end of the optical fiber is proximate to the first end of the waveguide wherein light is transmitted between the waveguide and the optical fiber.

3. The IC configuration of claim 2, further comprising a clamp portion, wherein the clamp portion is configured to apply a clamping force upon the optical fiber to maintain location of the optical fiber, wherein the first end of the optical fiber is proximate to the first end of the waveguide.

4. The IC configuration of claim 2, further comprising an optical couplant located between the first end of the optical fiber and the first end of the waveguide, the optical couplant configured to provide optical coupling for light transmission between the optical fiber and the waveguide.

5. The IC configuration of claim 1, further comprising a standoff located on the first surface of the first chip, wherein the standoff maintains a separation distance between the first surface of the first chip and the upper surface of the second chip.

6. The IC configuration of claim 1, further comprising a second conductive pad located on the upper surface of the second chip, wherein the second conductive pad is configured to touch the first conductive pad, the second conductive pad comprises the malleable material, wherein the malleable material deforms during location of the first chip and the second chip to form an electrical path between the first substrate and the second substrate.

7. The IC configuration of claim 1, wherein the at least one wall of the socket is angled such that as a force is applied to the first chip during location of the first chip with the second chip, the distal end of the pin slides into the socket.

8. The IC configuration of claim 1, wherein the pin comprises at least one of an oxide, nitride, metal, ceramic, an epoxy resin, a hardened epoxy resin, or benzocyclobutene (BCB).

9. The IC configuration of claim 1, wherein the socket is formed by lithography.

10. An integrated circuit (IC) comprising:
    a first die stacked on a second die, wherein the first die comprises a plurality of pins on a first surface of the first die, and the second die comprises a plurality of sockets on an upper surface of a substrate forming the second die, wherein a first socket in the plurality of sockets has an inverted pyramidal shape comprising at least three socket sidewalls, wherein each pin in the plurality of pins is respectively located in a respective socket in the plurality of sockets, each socket in the plurality of sockets has a sloped sidewall configured to converge at an apex in the substrate and a distal end of each pin in the plurality of pins abuts the sidewall of each socket in the plurality of sockets, wherein further the second die comprises a first conductive pad that is composed of a malleable material and that deforms when the first die is stacked on the second die such that the first conductive pad forms an electrically conductive path between the first die and the second die.

11. The IC of claim 10, further comprising:

a standoff located between the first surface of the first die and the upper surface of the second die, wherein the standoff has a thickness configured to position a first component located in the first die a particular distance from a position of a second component located in the second die.

12. The IC of claim 11, wherein the second component is a waveguide and the first component is a channel, wherein the channel locates an optical fiber and the channel is positioned such that light is transmitted between the waveguide and the optical fiber.

13. The IC of claim 11, wherein the first component is a laser and the second component is a waveguide, the laser is positioned such that light transmitted from the laser is incident upon the waveguide.

14. The IC configuration of claim 1, wherein the pin is formed on the first surface of the first chip such that the proximal end of the pin is attached to the first surface of the first chip.

15. The IC of claim 10, wherein the first die comprises a second conductive pad that is composed of a malleable material and that deforms when the first die is stacked on the second die such that the second conductive pad forms a second electrically conductive path between the first die and the second die.

* * * * *